United States Patent [19]

Papir

[11] Patent Number: 4,519,938
[45] Date of Patent: May 28, 1985

[54] ELECTROACTIVE POLYMERS

[75] Inventor: Yoram S. Papir, Emeryville, Calif.

[73] Assignee: Chevron Research Company, San Francisco, Calif.

[21] Appl. No.: 442,531

[22] Filed: Nov. 17, 1982

[51] Int. Cl.$^3$ ............................................. H01B 1/06
[52] U.S. Cl. .................................. 252/500; 252/510; 252/514; 252/518
[58] Field of Search ................. 252/500, 510, 514, 518

[56] References Cited

U.S. PATENT DOCUMENTS

| | | |
|---|---|---|
| 3,536,781 | 10/1970 | Cotter et al. . |
| 3,691,105 | 9/1972 | Juna et al. . |
| 3,828,008 | 8/1974 | Shinohara et al. . |
| 3,966,987 | 6/1976 | Suzuki et al. . |
| 4,156,757 | 5/1979 | Graser et al. . |
| 4,222,903 | 9/1980 | Heeger et al. . |
| 4,230,604 | 10/1980 | Wingrave . |
| 4,338,222 | 7/1982 | Limburg et al. . |
| 4,344,869 | 8/1982 | Blinne et al. . |
| 4,344,870 | 8/1982 | Blinne et al. . |
| 4,452,725 | 6/1984 | Wellinghoff et al. ............... 252/500 |

FOREIGN PATENT DOCUMENTS 0054587  6/1982  European Pat. Off. .

OTHER PUBLICATIONS

Aniodic Oxidation Pathways of Carbazoles, J. F. Ambrose et al., J. Electrochemical, Electrochemical Science, vol. 115, No. 11, Nov. 1968, pp. 1159-1164.

*Primary Examiner*—Lester L. Lee
*Attorney, Agent, or Firm*—S. R. LaPaglia; E. J. Keeling; A. Stephen Zavell

[57] ABSTRACT

Tractable doped electroactive polymers, comprising recurring units of a heterocyclic ring system and a sufficient concentration of charge compensating ionic dopants associated therewith.

25 Claims, No Drawings

ELECTROACTIVE POLYMERS

BACKGROUND OF THE INVENTION

This invention relates to electroactive organic polymeric materials. More specifically, this invention relates to incorporating electroactivating agents known in the art as dopants.

Recently, research has been conducted into organic polymeric materials in order to modify their room temperature electrical conductivity by reacting them with electron donor or acceptor molecules. The electron donor or acceptor molecules, generally known in the art as n- and p-type dopants respectively, can transform the organic polymeric materials so that these modified organic polymeric materials exhibit semiconducting and metallic room temperature electrical conductivity. Polyacetylene is an example of an organic polymeric material whose room temperature electrical conductivity can be modified over several orders of magnitude above its insulator state, by the incorporation of dopant molecules, A. J. Heeger et al, U.S. Pat. No. 4,222,903, said patent incorporated herein by reference. Other examples of organic polymeric materials whose room temperature electrical conductivity can be enhanced by several orders of magnitude over their insulator state by means of incorporation of dopant molecules are poly-p-phenylene, polypyrrole, poly-1,6 heptadiyne, and polyphenylene vinylene. However, all of the above recited examples are of organic polymeric materials which are completely insoluble or infusable and hence are completely intractable.

Other examples of organic polymers whose room temperature electrical conductivity can be modified with the aid of dopants are polyphenylene sulfide and poly-m-phenylene. However, the above recited materials though being tractable in their original virgin state, undergo irreversible chemistry when reacted with dopants which modify their room temperature electrical conductivity. This irreversible chemistry imparts upon these dopant modified organic polymeric materials a state of intractability. Upon removal of the doping agents, these materials do not revert to the chemical structure which they originally exhibited prior to being modified by the dopants. The inorganic material polysulfur nitride is also considered a polymeric conductor. As with the previously recited polymeric materials, polysulfur nitride is also completely intractable.

For use in a wide variety of electronic device applications, it is highly desirable to have available organic polymeric electrically conducting materials having a preselected room temperature conductivity which can be varied over a broad range. This range should preferably extend from the insulator state of the unmodified organic polymeric material through the semiconducting regime and extending into the highly conducting metallic state. It is also desirable that these organic polymeric electrically conducting materials should be tractable and hence processable so that useful articles of any desired shape and size can be fabricated. Tractable organic polymers are those which can be readily shaped, formed, molded, pressed, cast, etc., into desired articles from solution after the completion of the polymerization reaction of the organic polymeric material or from the liquid state, i.e. either from the melt, fluid glassy state or from solution.

SUMMARY OF THE INVENTION

I have discovered a class of tractable electroactive polymers comprising a linear charged polymer backbone and a sufficient concentration of a charge compensating ionic dopant(s) associated therewith, wherein said linear polymeric backbone is capable of undergoing reversible oxidation or reversible reduction or both to form said linear charged polymer backbone, said linear polymer backbone comprises diradical repeat units selected from the group consisting of a heterocylic ring system including at least on Group 5B or Group 6B atom, wherein none of the ring carbon atoms is saturated, a heterocyclic ring system including at least one Group 5B or Group 6B atom wherein none of the ring carbon atoms is saturated and a connecting unit, and mixtures thereof, wherein said diradical repeat unit contains no exocyclic double bonds and said diradical unit in the form of a monomeric repeat unit is capable of undergoing reversible oxidation or reversible reduction or both to form a stable ionic species, and wherein said connecting unit is a conjugated system or atom or group of atoms which maintain $\pi$ orbital overlap with the heterocyclic ring system with the proviso that the heterocyclic ring system excludes fused 5,6-membered heterocyclic ring systems wherein two heteroatoms are in the 5-membered ring.

Among other things, this invention is based on my unexpected discovery that the polymers in their virgin or unmodified state are excellent electrical insulators and that upon being doped, via chemical or electrochemical means, become useful electrical conductors.

Still another unexpected and useful aspect of my discovery is the ability to predict those polymer structures which are capable of being rendered electroactive according to the above-described procedure.

I have found that electroactive polymers as set forth above, are obtained when said monomeric repeat unit is capable of undergoing reversible oxidation and/or reduction to form a stable ionic species.

In addition, this invention is also based on my discovery that the modified or doped electroactive polymers possess the following useful and unexpected properties:

1. The electroactive polymers are tractable and hence processable.
2. The type of electrical conductivity, i.e. n-type or p-type of the desired electroactive polymers can be preselected.
3. The approximate redox potential of the desired electroactive polymer can be preselected.
4. The value of the room temperature electrical conductivity of the electroactive polymer can be preselected.

Electroactive polymer is defined as a polymer having a conductivity which has been modified with electron acceptor or donor dopants to be greater than the conductivity of the virgin or unmodified state of the polymer. The virgin or unmodified polymer is comprised of the repetitious linking of diradical repeat units and contains no branch points or cross links. Thus, it is considered to have a linear backbone. A diradical repeat unit is defined as the smallest structural building block of the polymer backbone having two unsatisfied positions available for linking. These are utilized to propagate the backbone.

The diradical repeat units are selected from the group consisting of a heterocyclic ring system, a heterocyclic ring system and a connecting unit, or mixtures thereof.

The heterocyclic ring systems include at least one Group 5B or 6B atom (IUPAC System). None of the ring carbon atoms in the heterocyclic ring system are saturated. More specifically, the heteroatoms are selected from the group consisting of N, P, As, Sb, and Bi for the Group 5B atoms and O, S, Se, and Te for the Group 6B atoms. N, O, and S are the preferred heteroatoms.

The heteroatoms are distributed among the ring system such that when the ring system is comprised of fused rings, the heteroatoms do not occupy the ring fusion positions. Furthermore, when more than one heteroatom is selected for a mono or fused heterocyclic system, no two heteroatoms can be adjacent to one another unless the heteroatoms are both nitrogen in which case no more than two adjacent nitrogens are permitted.

A connecting unit is defined as any atom or group of atoms which can link the heterocyclic ring systems together into a polymer chain without adversely effecting the reversible oxidation or reversible reduction of the polymer. The connecting unit must be conjugated or maintain the $\pi$ orbital overlap with the heterocyclic ring system.

The above-described polymers are capable of undergoing reversible oxidation, reversible reduction or both to form a linear charged polymer backbone. A charged polymer backbone is defined as a polymer backbone which has been partially or completely oxidized and/or reduced and possesses a net positive or negative charge which is compensated by the charge compensating ionic dopants. A charge compensating ionic dopant is defined as an ion or group of ions of opposite charge to the charge of the charged polymer backbone. The ions are associated with the polymer backbone but do not chemically react with or modify the charged polymer backbone. The charged polymer backbone plus charge compensating ionic dopants form the electroactive polymer which is electronically neutral but has a conductivity which is greater than the virgin polymer and preferably several orders of magnitude greater. A sufficient concentration is defined to be that concentration which when associated with the polymer, effects a significant increase in the conductivity, i.e. on the order of about 10% or greater.

Reduction of the linear polymer backbone is defined as the process of the addition of electrons to the $\pi$ system of the linear polymer backbone. Oxidation of the linear polymer backbone is defined as the process of the removal of electrons from the $\pi$ system of the linear polymer backbone. Reversible oxidation and/or reduction is defined as an oxidation and/or reduction process wherein, when the direction of the reaction is reversed, only the starting materials are recovered, and no new reactions appear.

The polymer is rendered electroactive by incorporating into the virgin polymer a sufficient concentration of a conductivity modifier or dopant, or by electrochemical means. More specifically, the polymer is rendered electroactive by adding electrons to (reducing) or removing electrons from (oxidizing) the virgin polymer backbone. This can be accomplished by incorporating into the virgin polymer a conductivity modifier which is either an electron donor dopant or an electron acceptor dopant.

An n-type electroactive organic polymer is obtained by reacting the virgin polymer with reducing or electron donor dopants. Electron donor dopants induce n-type conductivity in the polymer by donating an electron to the polymer and reducing same to a polyanion and the dopant is oxidized to a charge neutralizing cation.

A p-type electroactive organic polymer is obtained by reacting the virgin polymer with oxidizing or electron acceptor dopants. Electron acceptor dopants induce p-type conductivity in the polymer by oxidizing the polymer to a polycation and the dopant is reduced to a charge neutralizing anion.

Alternatively, the polymers can be oxidized or reduced to their electroactive or conductive forms using electrochemical techniques. In this method, herein referred to as electrochemical doping, the polymer is immersed in a suitable electrolyte solution and used as one electrode of an electrochemical cell. Upon passing an electric current through such a cell the polymer becomes reduced or oxidized (depending upon the direction of current flow) and charge compensating cationic or anionic dopants from the supporting electrolyte become incorporated into the polymer.

In both cases the resulting electroactive polymer consists of a charged polymer backbone incorporating charge-compensating ionic dopants. The charges of the polymer and the charge compensating ionic dopants balance so that the electroactive polymer is electrically neutral. Furthermore, the oxidation or reduction proceeds solely by an electron transfer.

The ability to predict in advance those polymer structures which are capable of being rendered electroactive, is yet another unexpected benefit of my invention. In order to determine if a specific polymer is capable of being modified or doped via chemical or electrochemical means to a useful electroactive conducting polymer, a diradical repeat unit is selected such that its corresponding monomeric repeat unit is capable of undergoing a reversible oxidation process, a reversible reduction process or both to form a stable ionic species. If the monomeric repeat unit does form a stable ionic species under either reduction or oxidation conditions, the polymer comprising the corresponding diradical repeat units will be electroactive.

An unexpected benefit of my invention is the ability to preselect the desired type of conductivity, i.e., n-type or p-type. If p-type conductivity is desired, an electroactive polymer is selected such that its repeating diradicals have a corresponding monomeric repeat unit which is capable of undergoing a reversible oxidation process to form a stable ionic species. Alternatively, if an n-type conductivity is desired, an electroactive polymer is selected such that its repeating diradicals have a corresponding monomeric repeat unit which is capable of undergoing a reversible reduction process to form a stable ionic species. A monomeric repeat unit is defined a diradical repeat unit wherein the unsatisfied positions are substituted by hydrogen atoms. The monomeric repeat unit must be capable of undergoing reversible oxidation or reversible reduction to a stable ionic species. A stable ionic species is defined as a charged atomic or molecular species in the condensed phase which maintains its chemical integrity throughout the course of the chemical process of interest.

Still another unexpected benefit of my invention is the ability to preselect the redox potential of the electroactive polymer. The electroactive polymer will exhibit a redox potential which is approximately equal to the redox potential of the appropriate monomeric repeat unit selected from the process described above.

Still another unexpected benefit of my invention is the ability to preselect the room temperature electrical conductivity.

The desired value of the room temperature electrical conductivity of the dopant modified electroactive organic polymer is preselected by controlling the level of incorporation of the dopants into the virgin polymer. Alternatively, the desired value of the room temperature electrical conductivity of the dopant modified electroactive organic polymer is preselected by controlling the length of the reaction time between the virgin polymer and dopants. Furthermore, the highly selective and reversible modification of the room temperature electrical conductivity of the virgin polymer can proceed by either chemical or electrochemical means. The above described polymers in both their unmodified or modified states are completely tractable and processable. The polymers in their virgin state exhibit excellent mechanical and thermal properties as well as being highly stable to oxidative degradation.

An alternative broader embodiment of my invention is the class of electroactive polymers including, in addition to all other suitable heterocyclic systems, the fused 5,6-membered heterocyclic ring systems wherein two heteroatoms are in the 5-membered ring.

The highly selective and reversible modification of the electrical conductivity of the dopant containing organic polymeric material together with the tractability and processability of the virgin polymer is highly desirable in that the fabrication of useful articles and devices such as primary and secondary batteries, photovoltaic devices, Schottky type devices can be accomplished.

DETAILED DESCRIPTION OF THE INVENTION

Electroactive organic polymers are fabricated from the modification of tractable and processable virgin polymers comprising a linear polymer backbone of recurring units of diradicals of said heterocyclic ring system, said heterocyclic ring system and a connecting unit, or mixtures of said diradicals, and conductivity modifiers.

Preferred diradical units forming said linear polymer backbone include:

Suitable fused 6,6,6-membered ring systems are disclosed, and completely incorporated herein by reference, in an application entitled "Fused 6,6,6-Member Heterocyclic Electroactive Polymers" by Peter Denisevich, Jr., filed concurrently herewith and assigned U.S. application Ser. No. 442,393. Examples of fused 6,6,6-member ring systems are thianthrenes, phenoxathriins, phenoxazine, phenothiazine, and the like. These polymers are preferably p-type, i.e. the polymers capable of undergoing a reversible oxidation.

Suitable fused 5,6-membered ring systems are exemplified and disclosed in U.S. application Ser. No. 397,731, filed July 13, 1982 completely and incorporated herein by reference. For example, benzoxazole, benzothiazole, N-alkyl-substituted benzimidazole, and the like. The polymers are capable of undergoing reversible reduction and thus form stable n-type polymers. A particularly preferred polymer is poly-2,2'-(p-phenylene)-6,6'-bibenzoxazole. This polymer is capable of undergoing a reversible oxidation and reversible reduction i.e. n-type and p-type characteristics. Another preferred polymer is poly-2,2'-(m-phenylene)-6,6'-bibenzoxazole. This polymer is capable of undergoing reversible oxidation and thus forms a stable p-type polymer.

Suitable 5,6-membered ring systems are disclosed, and completely incorporated herein by reference, in an application entitled "Fused 5,6,5-membered Heterocyclic Electroactive Polymers" by Victor Kurkov, filed concurrently herewith and assigned U.S. application Ser. No. 442,394. Preferred polymers exhibit n-type properties.

Suitable monocyclic heterocyclic systems are triazoles, heterodiazoles, such as thiadiazole, oxadiazole, and the like and heteroazoles such as oxazole and thiazole, all said monocyclic heterocyclic systems incorporate 1,4-phenylene as a connecting unit. Optionally these systems may incorporate other preferred connecting units. These polymers are disclosed in concurrently filed U.S. applications entitled "Heterodiazole Electroactive Polymers", "Heteroazole Electroactive Polymers", "Triazole Electroactive Polymers" and "Dithiene Electroactive Polymers", and assigned U.S. application Ser. Nos. 442,396; 442,397; 442,398; and 442,399 respectively, by S. Suzuki et al, filed concurrently herewith and completely incorporated herein by reference. Preferred polymers exhibit n-type characteristics. With the monocyclic systems, only those compounds whose corresponding monomeric repeat units are able to undergo reversible reduction or reversible oxidation to a stable ionic species are within the scope of the invention. Of course, any of the above heterocyclic systems can be substituted with one or more substituents as long as the ring carbon atoms remain unsaturated.

Preferably, the polymers are composed of repeating diradical units derived from fused 6,6-member nitrogen-containing ring systems. The fused rings may contain from one through six nitrogen atoms. However, no more than two adjacent nitrogens are allowed and the nitrogens are not allowed to occupy the ring fusion position. Suitable examples of single nitrogen fused ring systems are any of the diradicals of quinoline and isoquinoline. Suitable examples of two-nitrogen fused ring systems are any of the diradicals of cinnoline; quinazoline; quinoxaline; 2-phenyl-quinoxaline; phthalazine; 1,5-naphthyridine; 1,6-naphthyridine; 1,7-naphthyridine; 1,8-naphthyridine; 2,6-naphthyridine; copyrine; and the like. Suitable examples of three-nitrogen fused ring systems are any of the diradicals of 1,2,4-benzotriazine; pyrido[3,2-d]pyrimidine; pyrido[4,3-d]pyrimidine; pyrido[3,4-d]pyrimidine; pyrido[2,3-d]pyrimidine; pyrido[2,3-b]pyrazine; pyrido[3,4-b]pyrazine; pyrido[2,3-d]pyridazine; pyrido[3,4-d]pyridazine; and the like. Suitable examples of four-nitrogen fused ring systems are any of the diradicals of pyridazino[4,5-c]pyridazine; pyrimido[5,4-d]pyrimidine; pteridine; pyrimido[4,5-d]pyridazine; pyrimido[4,5-d]pyrimidine; pyrazino[2,3-d]pyrazine; pyrazino[2,3-d]pyridazine; pyridazino[4,5-d]pyridazine; pyrimido[4,5-c]pyridazine; pyrazino[2,3-c]pyridazine; pyrido[3,2-d]-as-triazine; pyrido[2,3-e]-as-triazine; and the like. Suitable examples of five-nitrogen fused ring systems are any of the diradicals of pyrimido[4,5-e]-astriazine; pyrimido[5,4-d]-as-triazine; and the like. Suitable examples of six-nitrogen fused ring systems are any of the diradicals of as-triazino[6,5-d]-as-triazine; and the like. All the previously mentioned fused nitrogen ring systems are known and disclosed in The Ring Index, second edition, and Supplements I, II and III, Patterson et al, American Chemical Society.

The ring systems recited above are synthesized into polymers by methods known in the art such as treatment with $ZnCl_2$ or $FeCl_3$ and an alkyliodide, or by dichlorination followed by reaction with appropriately disubstituted molecules such as: disodium sulfide, disodium salt of ethylene glycol, and the like. The diradicals can be modified with substituents which modify the polymer properties such as electron donating or withdrawing groups by methods known in the art.

Suitable compounds in which the nitrogens are in the ionic form, include quinolinium, and the like for the above compounds. The compounds are known and disclosed in The Ring Index and Supplements I, II and III. The polymers are fabricated by methods known in the art.

For example, an electroactive polymer can be fabricated with recurring units of positional diradicals of quinoline, substituted quinoline, isoquinoline, substituted isoquinoline and mixtures thereof. The diradicals can be linked at the 2,4; 2,5; 2,6; 2,7; 2,8; 3,5; 3,6; 3,7; 3,8; 4,6; 4,7; 4,8; 5,7; 5,8; and 6,8 positions, but connections at the 2,6 and 3,6 positions in the polymer are preferred. The quinoline ring system is numbered as follows:

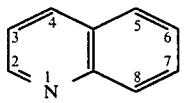

The isoquinoline ring system is numbered as follows:

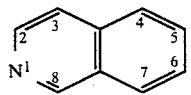

For example, the 2,6 diradical of quinoline has the formula:

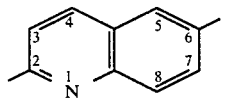

A preferred diradical of quinoline or isoquinoline is substituted in the 4 position. Preferably, the diradical is substituted with a phenyl group.

The diradicals can be separated by one or more connecting units. Preferred connecting units are biphenylene, —CH=CH—, and

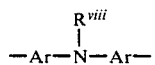

wherein Ar is phenylene or biphenylene and $R^{viii}$ is lower alkyl $C_1$-$C_4$. The connecting units can be the same or different between adjacent diradicals in the polymer chain.

The electroactive polymers of the invention have the following formula:

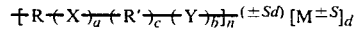

where a is either 0 or 1; b is either 0 or 1; c is either 0 or 1; n is an integer between 1 and 2000; d is an integer between 1 and 4000; s is an integer 1, 2, or 3; R is either an unsubstituted or substituted fused heterocyclic diradical ring system; R' is identical heterocyclic ring system to or different from R heterocyclic ring system; X is a connecting unit comprising of a single atom, or a group of atoms; Y is a connecting unit which is identical to or different from X; and M is an atom or a group of atoms acting as a charge compensating ionic dopant(s) whose electrical charge is opposite to the charge exhibited by the recurring repeat units:

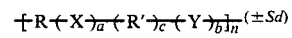

The repeat units form the polyanion or polycation of the electroactive polymer.

The diradical R or R' group is a substituted or unsubstituted system previously described. As an example and more specifically, the diradicals contain from one to six nitrogens distributed between the fused six-member rings wherein no more than 2 nitrogens are bonded sequentially. Suitable R groups are the diradicals of molecules recited previously which contain from one to six nitrogens. Preferred two nitrogen fused ring systems would be composed of substituted or unsubstituted diradicals of quinoxaline.

A more specific example occurs when R and R' are unsubstituted or substituted quinolinic and isoquinolinic diradical or mixtures of diradicals which are linked to one another either directly or via the connecting units X and Y by forming bridges. Preferably the bridges are formed at the 2,6 and 3,6 positions.

The connecting units X and Y can be selected from the group comprising:

—O—; —S—; —CH=CH—; —C≡C—;

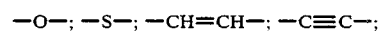

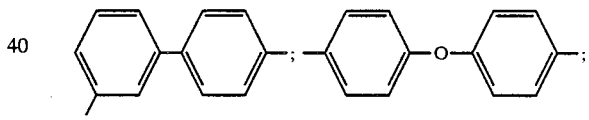

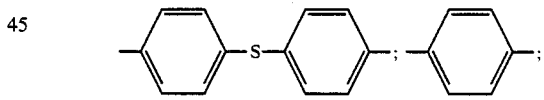

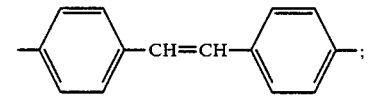

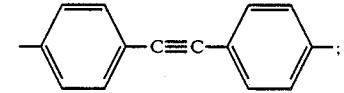

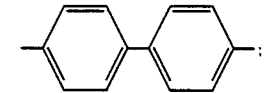

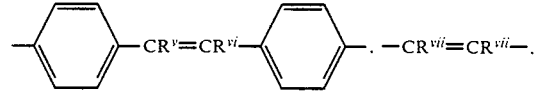

-continued and 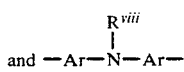

wherein $R^v$, $R^{vi}$ and $R^{vii}$ are H or methyl and mixtures thereof and $R^{viii}$ is lower alkyl $C_1$-$C_4$, or P-substituted phenyl, Ar is phenylene, or biphenylene. Biphenylene, vinylene, phenylene, and

are preferred connecting units.

The size of n determines the physical properties of the electroactive polymer. Preferably, n is from 10 to 1000 when c is zero. Most preferably, n is from 50 to 500 when c is zero. Tractable films are formed with electroactive polymer whose n exceeds 50. A preferred molecular weight is 10,000 or above.

The enhancement in conductivity of the electroactive polymer above the conductivity of polymer in the virgin state is determined by d. The conductivity is increased and adjusted by increasing d. For example, the virgin homopolymer of 2,6-(4-phenylquinoline) has a conductivity of about $10^{-15}$ ohms$^{-1}$ cm$^{-1}$. Incorporating about 20 weight percent of a charge compensating ionic dopant such as Na$^+$ in the electroactive polymer increases the conductivity to about $10^2$ ohms$^{-1}$ cm$^{-1}$. Preferred electroactive polymers are doped polymers that have conductivities greater than about $1 \times 10^{-10}$ ohm$^{-1}$ cm$^{-1}$, most preferably greater than $1 \times 10^{-4}$ ohm$^{-1}$ cm$^{-1}$. Conductivities in the range of semiconductors can be achieved when d is from about 10 to about 1000. Greater concentrations of the charge compensating ionic dopant M increase the conductivity to the metallic conductivity regime.

The polymer can be a homopolymer of the diradicals of quinoline, isoquinoline, and the substituted derivatives thereof or a copolymer of the diradicals. A homopolymer is defined as a polymer fabricated comprising the same recurring diradical. A copolymer is defined as a polymer comprising different diradicals. In addition, the polymer is a copolymer if the same or different recurring diradicals are interspersed with connecting units.

A suitable positively charged compensating ionic dopant can be a cation such as the alkali metal ions, alkali earth metal ions, group III metal ions and organic cations such as

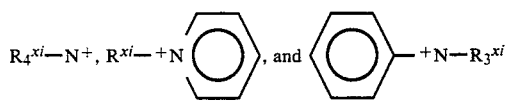

where $R^{xi}$ is a straight or branched chain alkyl of $C_1$-$C_6$ groups. Mixtures of these charge compensating ionic dopants can be employed. These ionic dopants produce n-type conductivity when associated with a reduced or negatively charged polymer polyanion.

Suitable negatively charged compensating ionic dopants, i.e. anionic dopants, can be an anion such as the halogen ions, other ions such as $AsF_4^-$, and preferably ions such as $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, organic anions ions such as $CH_3CO_2^-$, (acetate), $C_6H_5CO_2^-$ (benzoate), $CH_3C_6H_4SO_3^-$ (tosylate) and the like. Mixtures of the charge compensating inoic dopants can be employed. These ionic dopants produce a p-type conductivity when associated with an oxidized or positively charged polymer polycation.

The R and R' groups are the same or different. When a is 1, b and c are zero, R' and Y drop out and the polymer has the following formula:

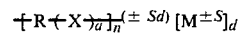

When a, b, and c are zero, R', X, Y drop out and the polymer has the formula:

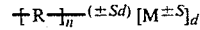

A preferred R or R' is selected from the group consisting of the diradicals of quinoline, substituted quinoline, isoquinoline and substituted isoquinoline. A preferred diradical is a 2,6 substituted quinoline of the formula:

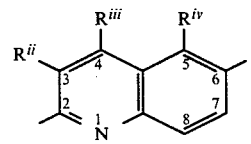

wherein $R^{ii}$, $R^{iii}$ and $R^{iv}$ are substituent groups selected from H; amino; alkyl 1 to 4 carbon atoms; alkoxy 1 to 4 carbon atoms; an alkylthio of 1 to 4 carbon atoms; a cycloaliphatic group of 5 or 6 carbon atoms; an alkenyl group of 2 to 4 carbon atoms; an aryl group of 6 to 10 carbon atoms; an aryl group of 6 to 10 carbon atoms substituted by 1 to 3 alkyl groups of 1 to 4 carbon atoms, alkenyl groups of 2 to 4 carbon atoms, alkynyl groups of 2 to 4 carbon atoms, alkoxy groups of 1 to 4 carbon atoms, 1 to 3 cyano groups, 1 to 3 halogen atoms, dialkyl amino groups of 1 to 4 carbon atoms, an alkylthiol of 1 to 4 carbon atoms; or a 5- or 6-member nitrogen containing unsaturated heterocyclic group. Electroactive polymers comprised of other heterocyclic ring systems described above can also benefit from the above-recited substituents. The heterocyclic ring system electroactive polymers described above in which one or more of the ring nitrogen heteroatoms are quaternized are also preferred.

The term "alkyl" refers to both straight- and branched-chain alkyl groups. Suitable examples are methyl, ethyl, propyl, isopropyl, butyl, i-butyl, s-butyl, and t-butyl.

The term "alkoxy" refers to the group $R^1O$— wherein $R^1$ is alkyl. Suitable examples are methoxy, ethoxy, propoxy, isopropoxy, butoxy, i-butoxy, s-butoxy, and t-butoxy.

The term "alkylthio" refers to such examples as methylthio, ethylthio, propylthio, isopropylthio, butylthio, i-butylthio, t-butylthio, and s-butylthio.

Suitable examples of cycloaliphatic are cyclopentyl, cyclohexyl, 3-methylcyclopentyl, and the like.

The term "alkenyl" refers to unsaturated alkyl groups having a double bond [e.g., $CH_3CH=CH(CH_2)_2$] and includes both straight- and branched-chain alkenyl groups such as ethenyl, but-3-enyl, propenyl, and the like.

The term "aryl" refers to an aromatic hydrocarbon radical such as phenyl, naphthyl, and the like. Suitable examples of an aryl substituted with an alkyl are 2-tolyl, mesityl, 3-isopropylphenyl and the like. Suitable examples of an aryl substituted with an alkenyl are 3-styryl, 4-i-propenylphenyl, and the like. Suitable aryl groups substituted with an alkoxy are 1-methoxy-2 naphthyl, 3-n-butoxyphenyl, and the like. Suitable aryl groups substituted with a cyano group are 4-cyanophenyl, 4-cyano-1-naphthyl, and the like. Suitable examples of an aryl with a halogen are 4-fluorophenyl, 3-chloro-4-bromo-1-naphthyl, and the like. Suitable examples of an aryl substituted with a dialkyl amino are 3-dimethylaminophenyl, 6-diethylamino-2-naphthyl, and the like. Suitable examples of an aryl substituted by an alkylthio are 4-butylthiophenyl, 3-methylthio-2-naphthyl, and the like. Suitable examples of 5- or 6-member nitrogen containing heterocyclic groups are 3-pyrrolyl, 4-pridyl, and the like.

Preferred polymers of 2,6 substituted quinoline occur when $R^{ii}$ and $R^{iv}$ are H. A preferred polymer is obtained when $R^{ii}$ and $R^{iv}$ are H and $R^{iii}$ is phenyl, i.e. poly 2,6-(4-phenylquinoline).

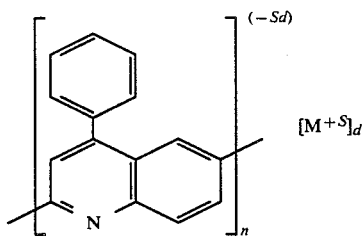

Another preferred group of polymers are obtained when $R^{iii}$ is phenyl and $R^{ii}$ and $R^{iv}$ are selected from the group of substituents previously recited.

Still another preferred polymer is fabricated from 2,6-(4-phenylquinolinium) diradicals wherein a $CH_3^+$ moiety is directly linked to the nitrogen of the quinoline diradical, i.e. quaternized.

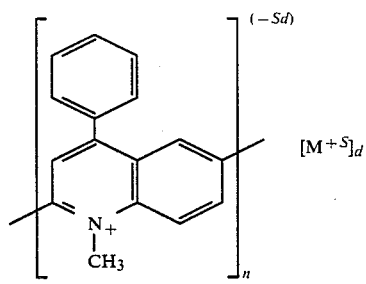

Another preferred polymer is fabricated of 2,6-(4-(4′pyridyl)quinoline) and/or its quaternized analog. When R and R' are the same and are the 2,6 quinolinic diradical unit, the recurring repeat unit of the dopant modified electroactive polymer is:

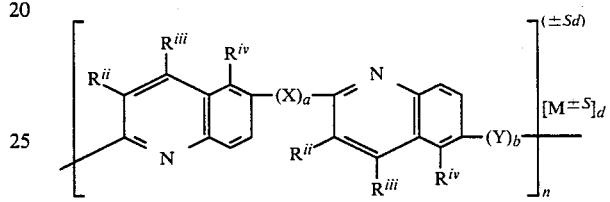

wherein $R^{ii}$, $R^{iii}$, and $R^{iv}$ are substituents selected from the groups recited above and X and Y are the connecting units previously recited. M is a previously recited conductivity modifier.

A preferred polymer has the formula

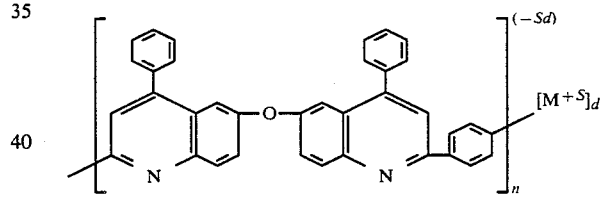

wherein $R^{ii}$ and $R^{iv}$ are H, $R^{iii}$ is phenyl a, b and c are 1, X is O diradical and Y is a phenyl diradical.

Another preferred polymer has the formula

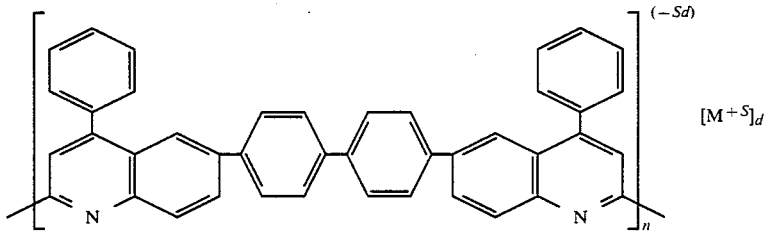

wherein $R^{ii}$ and $R^{iv}$ are H, $R^{iii}$ is phenyl, a and c are 1, b is zero, and X is a biphenyl diradical.

Another preferred polymer has the formula:

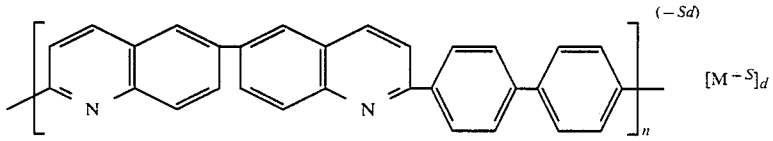

wherein $R^{ii}$, $R^{iii}$ and $R^{iv}$ are H, a is 0, b and c are 1 and Y is a biphenyl diradical.

Another preferred polymer has the formula:

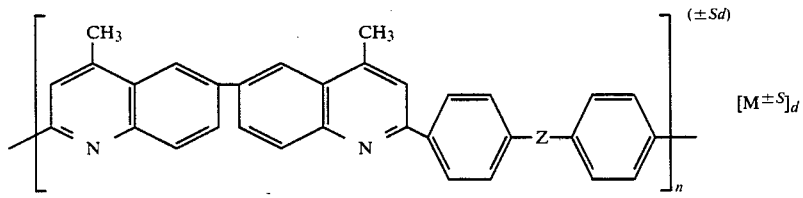

wherein $R^{ii}$ and $R^{iv}$ are H, $R^{iii}$ is —CH$_3$, a is 0, b and c are 1 and Y is

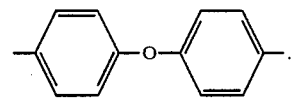

and Z is a connecting unit selected from the connecting units for X and Y.

Another preferred polymer is obtained when R and R' are substituted quinoline diradicals wherein $R^{ii}$ and $R^{iv}$ are H, a is 1, b is 1, c is 1, X is —CR$^{vii}$=CR$^{vii}$— and Y is —CR$^{vii}$=CH—. The polymer has the formula:

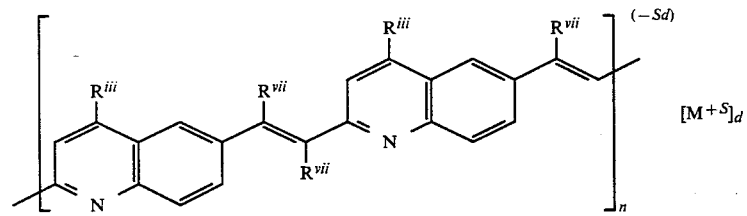

Still another preferred polymer is when $R^{iii}$ is phenyl and $R^{vii}$ is H.

When R or R' are substituted isoquinoline diradical, a preferred diradical has the formula:

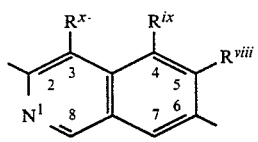

wherein $R^{viii}$, $R^{ix}$, and $R^{x}$ are selected from the same substituent groups as $R^{ii}$, $R^{iii}$, and $R^{iv}$. Similar polymers to the previously recited preferred quinoline polymers are also preferred for isoquinoline.

A preferred electroactive poly(phenyl quinoxaline) polymer has the formula:

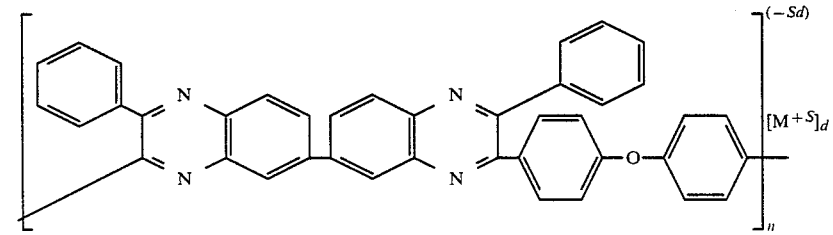

where R and R' are phenyl quinoxaline, a is 0, b and c are 1 and Y is

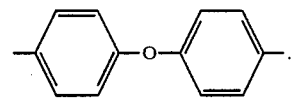

Polymer Fabrication

The starting material for preparing the electroactive polymers of this invention are linear polymers and linear copolymers comprising diradical recurring units of fused nitrogen containing unsaturated heterocyclic ring system. Preferably the recurring units are diradicals of quinoline or isoquinoline or substituted quinoline or isoquinoline. These polymers and copolymers are well known materials having been synthesized in a variety of ways. For example, quinoline, isoquinoline, or substituted derivatives thereof can be converted into polymers by treatment with zinc chloride or by treatment with FeCl$_3$ and an alkyliodide, Rabinovich et al, Dokl. Akad. Nauk SSSR 1971, 199(4), 835–7 and Smirnov et al, Vysokomol Soedin Ser B 1971, 13(6), 395–6, respectively, incorporated by reference. The method is also suitable to polymerize the other diradicals previously recited.

Other polymers are made by a synthetic route involving the reaction of the dichloro or dibromo derivatives of fused nitrogen containing unsaturated heterocyclic units with magnesium in ether followed by contacting with a nickel salt. The dihalo derivatives having halogens in essentially all possible combinations are known. This route provides a method of preparing polyquinolines or polyisoquinolines having bridges through any two of the seven possible points of attachment.

The dihalo compounds are also useful in forming copolymers with other interconnecting groups. For example reactions with sodium sulfide gives a sulfur atom between each nitrogen heterocycle. Reaction with dihydroxy or disodium salts of dihydroxy compounds give ether-linked type copolymers.

Another method of making the polymeric starting material is by a synthesis involving the final reaction of an appropriate diketone with an appropriate aminodiacylbenzene in the presence of a base or an acid catalyst as discussed in Korshak et al, Vysokomol, Soedin., Ser B9(3), 171-2(1967); Shopov, I, Vysokomol.Soedin., Ser B 1969, 11(4) 248; Garapon, J et al, Macromolecules 1977, 10(3) 627-32; Stille, J. K et al, Polym. Prepr., Am Chem. Soc., Div. Polym. Chem 1976, 17(1), 41-45; Stille, J. K. Pure Appl. Chem. 1978, 50(4), 273-280; Baker, G. L. et al Macromolecules 1979, 12(3), 369-73; and Beever, W. H. et al Macromolecules 1979, 12 (6), 1033-8, all of said articles incorporated herein by reference.

Still another method of preparing polyquinolines useful as starting materials for the compounds of this invention is by the condensation polymerization of appropriate di(aminophenyl) compounds with appropriate di(alpha,gamma-diketo)compounds, see V. Korshak et al, Vysokomol Soedin, Ser B9(3), 171, (1967). The resulting polymers have structures of formula

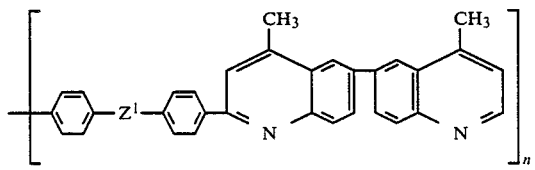

wherein $Z^1$ is O.

The di(aminophenyl) compounds may contain a variety of substituents but must have an unsubstituted position ortho to the amino group. Typical compounds include 4,4'-diaminobiphenyl, 3,3'-diaminobiphenyl, 2,4'-diaminobiphenyl, 2,2'3,3'-tetramethyl-4,4'-diaminobiphenyl, di(4-aminophenyl)methane, di(4-aminophenyl)ether, 1,2-di(4-aminophenyl)ethane, 1,2-di(4-aminophenyl)ethylene, and the like.

The di(alpha,gamma-diketo) compounds comprise those compounds wherein the diketones are joined at the alpha-position through various connecting groups. These compounds have the structure:

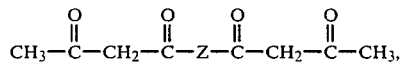

wherein Z is a connecting group. Typical connecting groups include the X and Y connecting groups having 2 or more atoms, French Pat. No. 1,468,677 and J. Polym. Sci. Part C, #16 Part 8, 4653 (1968), incorporated herein by reference.

The preferred method for making the polyquinoline polymeric starting material is in accordance with the procedures outlined by W. H. Beever, et al., Journal of Polymer Science: Polymer Symposium 65, pp. 41-53 1978; S. O. Norris, et al., Macromolecules, Vol. 9, No. 3, May-June, 1976, pp. 496-505, J. Pharm. Sci. 57 784 (1968), and J. Heterocycle Chem. 11 107 (1974), all said articles incorporated herein by reference.

Other heterocyclic linear polymers comprised of the above-recited diradical repeat units can be fabricated in accordance with the procedures outlined in the applications previously recited and incorporated herein by reference.

Tractable Polymer Fabrication

Subsequent to polymerization, articles such as fibers, ribbons, or free-standing films are cast from solution. The solution is formed by dissolving the desired polymer in a strong acid solvent such as sulfuric acid, formic acid, polyphosphoric acid, and the like, or a mixture of $P_2O_5$ and m-cresol. The solution temperature is maintained from about 25° C. to about 200° C. In the case of polyquinoline dissolved in $P_2O_5$/m-cresol, the solution temperature is preferably maintained at about 140° C. and most preferably at 100° C. The polymers are coagulated into solid shapes such as fibers, ribbons, or free-standing films in a basic coagulation bath. For free-standing films, the polymers are fabricated from solutions containing about 2 to 25% polymer dissolved in the solvent. At concentrations which exceed 10%, the cast films take on an anisotropic morphology. The anisotropic property enhances the conductivity in the anisotropic direction. An amine, for example triethylamine, dissolved in a protonic solvent such as $H_2O$ and preferably ethyl alcohol comprises the coagulation bath. The bath is maintained at a lower temperature than the dissolution temperature of the polymer in the solvent. Usually room temperature is selected as the operating temperature of the coagulation bath. Alternatively, the desired articles are coagulated in a coagulation bath which contains water and which is maintained at room temeprature. Subsequently, the coagulated article is immersed in a neutralization bath consisting of a bicarbonate salt of alkali metals dissolved in water. Sodium bicarbonate is preferred. The article is next washed repeatedly with fresh water. The fabricated articles are dried. Elevated temperatures, usually 60° C., and reduced pressure accelerated the drying process. Drying is continued until no further weight loss is observed.

Polymer Conductivity Modification

After fabrication of the desired articles by means of the procedure described above, the articles are rendered electroactive by chemical or electrochemical procedures. The articles are rendered electroactive by contacting them with suitable conductivity modifiers, i.e. dopants. The reaction which renders the articles electroactive, must be carried out in an inert atmosphere. An inert atmosphere is defined as an atmosphere which does not react with the polymer, the dopant, or the electroactive polymer. For example, the atmosphere can be argon, helium, and nitrogen and the like. The dopants can be oxidizing or electron accepting molecules, or reducing or electron donating molecules. Both types of dopants may be in the form of gases or vapors, pure liquids or liquid solutions. When liquid solutions are employed, solvents such as tetrahydrofuran, acetonitrile and the like are preferred. Preferably, oxygen and water moisture are excluded during and after the doping process because the conductive polymers tend to degrade, i.e. lose conductivity, when exposed thereto.

For example, the polymer can be contacted with dopants or conductivity modifiers such as alkali naphthalides or alkali anthracenides such as sodium naphthalide, potassium naphthalide, or sodium anthracenide dissolved in tetrahydrofuran. The conductivity modifier concentration can be from about 0.001 to about 1 molar and preferably from about 0.01 to about 0.5 molar in the THF or other suitable solvent. Alternative doping methods are taught in U.S. Pat. Nos. 4,204,216 and incorporated herein by reference.

The process of electroactivating the above articles by contacting them with suitable dopants can be observed by a color change in the polymer as well as an enhancement in electrical conductivity. For example, a virgin or undoped poly-2,6-(4-phenylquinoline) film having a yellow or orange color, changes to a blue or black color with a metallic luster upon doping with sodium naphthalenide or anthracenide and the measured conductivity increases by 17 orders of magnitude. Other heterocyclic polymers recited above when doped with suitable conductivity modifiers exhibit corresponding changes in color and conductivity.

Alternatively, the polymers can be oxidized or reduced to their conductive forms using electrochemical techniques. In this method, herein referred to as electrochemical doping, the polymer is immersed in a suitable electrolyte solution and used as one electrode of an electrochemical cell. Upon passing an electric current through such a cell the polymer becomes reduced or oxidized (depending upon the direction of current flow) and charge compensating cationic or anionic dopants from the supporting electrolyte become incorporated into the polymer. This doping also proceeds with the characteristic color change described above. Thus, the polymer can be electrochemically doped with whatever appropriately charged ion is present in the electrolyte solution. Electrolyte solutions are comprised of a salt dissolved in a solvent. Suitable solvents are acetonitrile, tetrahydrofuran, 2-methyl-tetrahydrofuran, propylene carbonate, dimethylformamide, dimethylsulfoxide and the like. Suitable cations are $Li^+$, $Na^+$, $K^+$, $(CH_3)_4N^+$, $(C_2H_5)_4N^+$ and $(C_4H_9)_4N^+$. Suitable anions are $Cl^-$, $Br^-$, $ClO_4^-$, $BF_4^-$, and $PF_6^-$. The extent of doping and hence the desired level of electrical conductivity, can be easily controlled by adjusting the amount of charge electrochemically injected into the polymer. This is accomplished by either controlling the magnitude of the current used (galvanostatic charging) or by controlling the potential of the polymer electrode with respect to a reference electrode (potentiostatic charging).

The above-described electrochemical doping process is completely reversible. The polymer can be "undoped" and returned to its original, neutral, non-conducting state simply by applying a current opposite in sign to that used for the doping process. Upon complete undoping the color of the polymer reverts back to its original color. Thus, for example, a reduced, conducting, black-blue with metallic luster poly-2,6-(4-phenylquinoline) polymer can be reoxidized completely to its original yellow color, neutral, non-conducting form, and the charge-compensating cations incorporated during the electrochemical reduction process are expelled from the article during electrochemical re-oxidation.

My previous U.S. applications Ser. Nos. 264,915, filed May 18, 1981; 304,410, filed Sept. 21, 1981; and 370,231, filed Apr. 22, 1982, are completely incorporated herein by reference.

Having described the chemical composition of the useful electroactive polymers of this invention, the method of fabrication then into articles of many useful shapes, and the methods of electroactivation of these articles into useful electrical conductors, the following examples are intended to be illustrative of the invention and not meant to limit the scope thereof. Modification which would be obvious to one of ordinary skill in the art are contemplated to be within the scope of the invention.

EXAMPLES

Example 1a

Preparation of 2-methyl-2-(4-nitrophenyl)-1,3 dioxolane

P-Nitroacetophenone (1.65 g, 10 m mol), ethylene glycol (5 ml, 89 m mol), triethyl orthoformate (2.96 g, 20 m mol), and p-toluenesulfonic acid (0.086 g, 0.5 m mol) were combined in methylene chloride (4 ml). The solution was heated with an oil bath (50°–70° C., 6 hrs), cooled to room temperature, and poured into excess 10% sodium hydroxide solution. The phases were separated and the aqueous phase was extracted twice with methylene chloride. The combined organic phase was washed three times with water and dried with anhydrous sodium sulphate. Evaporation of the solvent left a light yellow product (1.78 g) with mp. 69°–71° C., [lit. 73°–75° C., see J. Pharm. Sci. 57, 784 (1968)].

Example 1b

Preparation of 5-(2-Methyl-1,3-dioxolan-2yl)-3-phenyl-2,1-benzisoxazole

Phenylacetonitrile (0.84 g, 7.2 m mol) and 2-methyl-2-(4-nitrophenyl)-1,3-dioxolane (mp. 69°–71° C.) (1.50 g, 7.2 m mol) were added to a room temperature solution of sodium hydroxide (1.44 g, 36 m mol) in methanol (8 ml). A slight exotherm was noted and stirring was continued for 16 hrs. The mixture was filtered and the collected solid washed several times with water and once with cold methanol to yield a yellow powder (1.60 g) with mp. 137° C. [lit. mp. 137°–138° C., see J. Heterocyclic Chem. 11, 107 (1974)].

Example 1c

Preparation of 2-Amino-5-(2-methyl-1,3-dioxolan-2-yl)benzophenone 5-(2-Methyl-1,3-dioxolan-2yl)-3-phenyl-2,1-benzisoxazole (1.50 g, 5.3 m mol), triethyl amine (0.3 ml) and 5% palladium on carbon (0.15 g) were combined in dry tetrahydrofuran (13 ml). The apparatus wa flushed with nitrogen and then hydrogen. A static hydrogen atmosphere was maintained (1 atm.) and the progress of the reaction followed by gas chromatography. The starting material and product have retention times of 11.15 and 11.33 min. respectively. When conversion was complete, the mixture was filtered through a pad of Celite to yield a clear yellow solution. Evaporation of the solution yielded a yellow solid (1.35 g) of mp. 108°–111° C.

Example 1d

Preparation of 5-Acetyl-2-aminobenzophenone

2-Amino-5-(2-methyl-1,3-dioxolan-2-yl)benzophenone (1.0 g, 3.54 m mol) was dissolved in 30 ml absolute ethanol. To this was added 1M perchloric acid (14 ml). The resulting mixture was stirred at room temperature for 18 hrs. The mixture was made basic with 3N sodium hydroxide solution and then extracted with several portions of methylene chloride. The combined methylene chloride extracts were washed with water, dried with anhydrous sodium sulfate, and evaporated to yield a yellow product (0.79 g) of mp. 158°–161° C. A portion of the product was recrystallized from a mixture of methylene chloride and hexane to yield material of mp. 158°–162° C.

Example 1e

Preparation of Poly 2,6-(4-phenylquinoline)

A solution was prepared from phosphorous pentoxide (1.07 g, 7.5 m mol) and freshly distilled m-cresol (2.5 ml) by heating at 140° C. for 2.5 hrs. under nitrogen. The solution was cooled to room temperature and 5-acetyl-2-aminobenzophenone (0.30 g, 1.28 m mol) and m-cresol (1.3 ml) were added. The solution was heated to, and maintained at 120° C. for 48 hrs. The hot solution was poured with stirring into a mixture of 95% ethanol (60 ml) and triethylamine (6 ml) to yield a fibrous yellow solid which was washed twice with ethanol in a Waring blender. It was then extracted with ethanol (19 hrs) in a Soxlet apparatus and dried to give an orange product (0.26 g, 1.28 m mol).

Example 2

Preparation of Films of Poly 2,6-(4-phenylquinoline) Films

A solution was prepared from phosphorous pentoxide (0.8 g, 5.6 m mol) and distilled m-cresol (2.5 ml) by heating at 110°–120° C. under Argon. The solution was cooled to room temperature and poly 2,6-(4-phenylquinoline) (0.051 g, 0.25 m mol) prepared in Example 1e added. The mixture was heated to 140° C. to yield a viscous deep red solution. Free-standing films were prepared by spreading a few drops of this solution on a heated glass plate and quenching in a bath of triethylamine (10%) and ethanol (90%). The clear yellow films were pressed between layers of filter paper and dried in a vacuum oven.

Example 3

Doping of Poly 2,6-(4-phenylquinoline)

The transparent, yellow film prepared in Example 2 was placed in a jar, in a dry box with a dry argon atmosphere. After 30 minutes, a dimethoxyethane solution of sodium naphthalide was poured into the jar. The film reacted immediately, changing to a dark color; green-blue in transmitted light and purple-green with metallic sheen in reflected light. Upon exposure to air, the dark color disappears instantly, and the polymer resumes its original appearance.

Example 4

Conductivity Measurement of Poly 2,6-(4-phenylquinoline)

The procedure of example 3 was followed except the film was first wet with tetrahydrofuran (THF) and then treated with 0.1M sodium naphthalide in THF. Upon addition of the sodium naphthalide, the polymeric film turned deep blue with a metallic luster. The surface of the film was rinsed with THF and dried. The conductivity of the doped film ($2.54 \times 10^{-3}$ cm thick) was measured using a 4-point probe apparatus of the Signature Co. The 4 points of the apparatus form a single line. A DC voltage (VE) is applied across the outermost two points, and the voltage (VI) is measured across the inner two points. From these values a conductivity are calculated as follows:

$VE = 0.1$ volts
$VI = 0.06$ volts (measured)
$R = 1074 \, (VE/VI) = 1790$ ohms/square
rho = $Rxt = 1790 \times 2.54 \times 10^{-3} = 4.55$ ohm centimeters
sigma = $1/\text{rho} = 0.22$ ohm$^{-1}$ centimeter$^{-1}$ where:
VE = impressed voltage
t = film thickness
VI = measured voltage
R = resistance of the surface
rho = resistivity of the article
sigma = conductivity
1074 = instrument and unit conversion factor The washed, but undoped polymer, was not conductive, but actually was an insulator having a conductivity of $10^{-5}$ ohms$^{-1}$ centimeter$^{-1}$ as measured on the same apparatus, (See J. Polym. Sci. Poly. Symp., 65, 41 (1978). This same value ($10^{-15}$) was measured on the doped film after turning yellow upon exposure to air.

The infrared spectra of the original undoped film and the air-exposed doped film were the same. The infrared of the dark, sodium naphthalide doped film was opaque with no adsorption between 4000 and 600 cm$^{-1}$, indicating metallic behavior. This experiment shows that the doped polyquinoline films are surprisingly good electrical conductors.

Example 5

Conductivity Measurement of Poly 2,6-(4-phenylquinoline)

Films were also doped as in Example 4 but with potassium naphthalide and after these films had been kept for 6 days in a dry box the following conductivity value was obtained:

$VE = 36$ mv
$VI = 55$ mv
$t = 2.54 \times 10^{-3}$ cm
rho = 1.78 ohm cm.
sigma = 0.56 ohm$^{-1}$ cm$^{-1}$ Values of this magnitude show the doped polymer to be electroactive in that it is a conductor of electricity.

Example 6a

Preparation of bis-4-Nitrophenylether

1-Fluoro-4-nitrobenzene (20.0 g, 0.142 mol), 4-nitrophenol (19.7 g, 0.142 mol), and potassium fluoride (28.3 g, 0.486 mol) were combined in 75 ml dimethylsulfoxide and heated to reflux for 0.5 hrs. The mixture was cooled and left at room temperature overnight.

The precipitate was collected and washed with water. It was dissolved in warm toluene, separated from a water layer and dried with magnesium sulfate. Concentration and cooling yielded 28.8 g of product (mp 144°–146° C.) in two crops.

Example 6b

Preparation of 5,5'-Oxybis-(3-phenyl-2,1-benzisoxazole)

Phenylacetonitrile (17.72 g, 0.151 mol) and bis-4-nitrophenylether (19.52 g, 0.075 mol) were added to a room temperature solution of sodium hydroxide (30.01 g, 0.75 mol) in methanol (150 ml) and heated at reflux for 9 hrs. The reaction mixture was cooled to room temperature and diluted with 50 ml of 50% methanol in water and then cooled in an ice bath. The precipitate was collected and washed with cold methanol. This solid was dissolved in warm toluene, dried with magnesium sulfate, concentrated, and cooled to yield 7.55 g. Recrystallization from warm toluene gave 5.19 g of product mp 208°–209° C. A second, unidentified material, mp 158°–165° C., was also isolated.

Example 6c

Preparation of 4,4′-Diamino-3,3′-dibenzoyldiphenylether 5,5′-Oxybis-(3-phenyl-2,1-benzisoxazole) (4.92 g, 12.0 m mol) and triethylamine (1.35 ml) were combined in tetrahydrofuran (50 ml) under a nitrogen atmosphere. Palladium on carbon (5%, 0.41 g) was added and then hydrogen was slowly passed through the system for 15 hours. The mixture was filtered through Celite and evaporated to a yellow oil which was crystallized from a mixture of toluene and hexane (10 to 1) to yield 4.33 g (87%) of the desired product. This was further purified by recrystallization from methanol to yield 2.43 g with mp 154°–155° C.

Example 6d

Preparation of a Quinoline Copolymer from 4,4′-Diamino-3,3′-dibenzoyldiphenyl ether and p-Diacetylbenzene A solution was prepared from phosphorous pentoxide (5.6 g, 39.4 m mol) and freshly distilled m-cresol (20 ml) by heating to 140° C. A portion of this solution (7.6 ml) was used to dissolve, 4,4′-diamino-3,3′-dibenzoyldiphenyl ether-(0.5005 g, 1.225 m mol) and p-diacetylbenzene (0.1987 g, 1.225 m mol). The solution was maintained at 110°–120° C. for 48 hrs. The mixture was cooled and poured into a mixture of triethylamine (10 ml) and 95% ethanol (100 ml) to yield a white fibrous product. The product was dissolved in chloroform (15 ml) and precipitated with ethanol. This was repeated to finally yield 0.10 g of white, fibrous polymer. A film was prepared by dissolving 25.7 mg in 0.52 g of the above phosphorous pentoxide-m-cresol solution at 60° C., placing a few drops on a warm glass plate, and spreading with a warm blade. After quenching in a 90% ethanol–10% triethyl amine bath, a free-standing film was obtained. This polymer has the following structure:

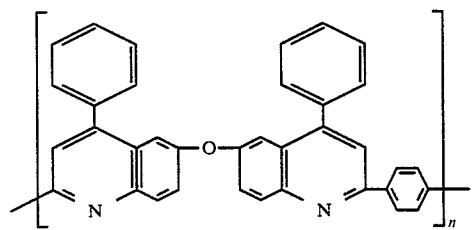

Example 7

Doping and Conductivity Measurement of the Polymer of Example 6

Films of the polymer of Example 6d were kept in a dry box for 2 weeks at less than 10 ppm water and oxygen. Thereafter the films were doped with sodium naphthalide as described in Example 3. Upon doping, the films turned a deep metallic blue in color. Conductivity measurements gave:

VE=4.5 mV
VI=0.3 mV
R=16110 ohms per square
rho=40.92 ohm cm.
sigma=0.024 ohm$^{-1}$cm$^{-1}$

Example 8a

Preparation of 5-Bromo-3-phenyl-2,1-benzisoxazole

Phenylacetonitrile (8.1 g, 69 m mol) was added to a room temperature solution of potassium hydroxide (85%) (74 g, 1.1 mol) in methanol (150 ml). To this was added 4-bromo-1-nitrobenzene (12.7 g, 63 m mol) suspended in methanol (130 ml). An exotherm was noted and the reaction was maintained at 50° C. for 5 hrs. After cooling to room temperature, water (400 ml) was added. The precipitate was collected and washed with water. The crude product (13.15 g) was crystallized from hot methanol (200 ml) to yield yellow needles (9.52 g, mp 113°–116° C.).

Example 8b

Preparation of 2-Amino-5-bromobenzophenone

5-Bromo-3-phenyl-2,1-benzisoxazole (7.5 g, 28.6 m mol), water (14.6 ml), and zinc dust (9.3 g, 143 m mol) were combined. Acetic acid (8.6 ml, 143 m mol) was added and the mixture was stirred and heated at 80° C. for 90 minutes. After cooling to room temperature, both the liquid and solid portion of the reaction were extracted with methylene chloride. The combined methylene chloride solutions was washed once with sodium hydroxide solution (10%) and several times with water. Drying (sodium sulfate) and evaporation yielded the desired product (7.42 g) of mp. 92°–102° C.

Example 8c

Preparation of 4,4′-Diamino-3,3′-dibenzoylbiphenyl

4-Bromo-2-aminobenzophenone (0.55 g, 2.0 m mol) was dissolved in dry and deoxygenated dimethylformamide (10 ml) in an inert atmosphere box. To this was added in portions bis(1,5-cyclooctadiene)nickel(O) (0.55 g, 2.0 m mol). The reaction was moved from the inert atmosphere box to a vacuum-argon manifold using standard Schlenk-wave techniques. The reaction was heated at 50°–55° C. for 4 hrs. and left at room temperature overnight. The mixture was poured into 200 ml of water which was made slightly basic with sodium hydroxide. The water was extracted several times with ethyl acetate which after drying with sodium sulfate and evaporation gave a dark brown liquid (0.48 g). Recrystallization from hexane yielded 100 mg of yellow brown solid mp 180°–185° C.

Example 8d

Preparation of a Copolymer from 4,4′-Diamino-3,3′-dibenzoylbiphenyl and 4,4′-diacetylbiphenyl 4,4′-Diamino-3,3′-dibenzoylbiphenyl (80.0 mg, 0.204 m mol) and 4,4′-diacetylbiphenyl (48.6 mg, 0.204 mmol) were combined in a solution prepared from phosphorous pentoxide (0.348 g, 2.45 m mol) and freshly distilled m-cresol (1.2 ml) and heated at 120°–130° C. for 46 hrs. The hot reaction mixture was poured with stirring into a mixture of triethylamine (6 ml) and 95% ethanol (60 ml). The fibrous red precipitate was stirred in the basic bath until its color changed to yellow. It was washed with water and dried at 80° C. to yield 120 mg of yellow powder mp>320° C. Films of this material were prepared by dissolving 50 mg at 120° C., in m-cresol (0.75 ml) containing phosphorous pentoxide (0.2 g). A few drops of this solution were spread on a glass plate and quenched in a bath of triethylamine (10%) and ethanol (90%) to yield a freestanding yellow film. This copolymer has the structure:

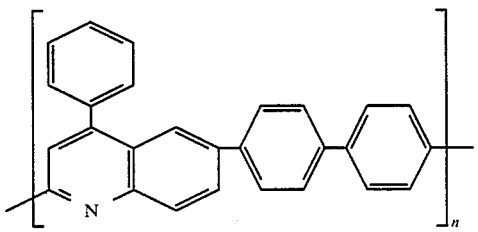

Thereafter, the polymer was rendered conductive in accordance with the procedure outlined in Example 3. The conductivity was measured in accordance with the procedures outlined in Example 4. The conductivity of the doped polymer was 0.024 ohm$^{-1}$ cm$^{-1}$.

Example 9

Preparation of Poly 2,6-(4-(4'chlorophenyl)quinoline)

This polymer was prepared by essentially the same process as described in Example 1, except that 4-chlorophenyl acetonitrile was used in place of phenylacetonitrile. Analysis of the polymer gave the following results. Calculated for ($C_{15}H_8NCl$): C, 75.80%; H, 3.39%; N, 5.89%; Cl, 14.92%. Found: C, 76.81%; H, 3.64%; N, 5.86%, the remainder being Cl. The polymer has the structure:

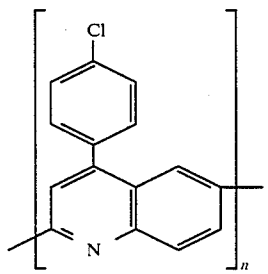

Thereafter, the polymer was rendered conductive in accordance with the procedure outlined in Example 3. The conductivity was measured in accordance with the procedures outlined in Example 4. The conductivity of the doped polymer was 0.02 ohm$^{-1}$ cm$^{-1}$.

Example 10

Electrochemical Doping of Polyquinoline Polymers

A 5-inch platinum wire was coated with a thin film of the polymer of Example 1, by dipping the wire into a 5% solution of the polymer in a m-cresol/$P_2O_5$ mixture. The film-coated wire was neutralized by dipping into a 10% triethylamine–90% ethanol solution and dried in a vacuum oven at 60° C.

The polymer coated wire was connected to an E.G. and G. Princeton Applied Research Apparatus comprising a Universal programmer and a Potentiostat/Galvanostat, with recorder. The polymer coated end of the wire was then immersed into a 0.1M solution of lithium tetrafluoroborate in acetonitrile. A potential, varying from 0 to −3.0 volts vs. SCE was applied to the platinum wire. The output current was essentially nil until the potential reached about −1.5 volts at that point the cathodic current increased rapidly and peaked at −2.25 volts. Upon reversal of the potential sweep, an anodic current was observed which peaked at −1.5 volts. When the initial −1.5 volt potential was applied, the polymer adhering to the wire turned from a pale yellow to a dark metallic color, which color disappeared upon raising the voltage to more than −1.5 volts.

This behavior indicates an initial resistance to passage of current followed by a rapid uptake of electrons resulting in a charged electroactive polymer containing lithium ions as the charge compensating dopant. In effect the polymer was made electroactive by the application of a potential of about −2 volts in the presence of an electrolyte solution capable of providing a charge compensating dopant.

Example 11

Electrochemical Doping of Polyquinoline Polymers

The same experiment as Example 10 was carried out except that the lithium tetrafluoroborate was replaced by tetrabutyl ammonium bromide. Essentially the same results were obtained as in Example 10. In this case the polymer coated wire was alternately charged and discharged without any loss in activity. The metallic color came and went as the polymer was charged and discharged.

This experiment indicates that the charged electroactive polymer can be used as an electron source. One useful application is as the anode of a battery. It also shows that the electroactive polymer is able to incorporate into its structure organic charge compensating ionic dopants.

Example 12

Electrochemical Doping of Poly(phenyl-quinoxaline)

A 5-inch platinum wire was coated with a thin film of a polymer of the structure

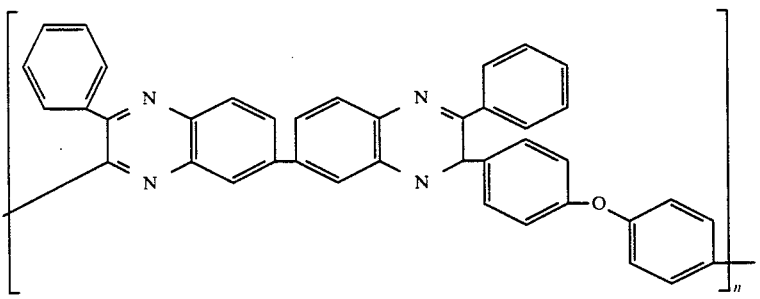

by dipping the wire into a 5% solution of the polymer in an m-cresol/P$_2$/O$_5$ mixture. The virgin polymer was purchased from Scientific Polymer Product, Inc., 6265 Dean Parkway, Ontario, N.Y. Catalogue #330 lot 101. The polymer is 100% solids in m-cresol. The film-coated wire was neutralized by dipping into a 10% triethylamine-90% ethanol solution and dried in a vacuum oven at 60° C.

The polymer coated wire was connected to an E.G. and G. Princeton Applied Research Apparatus comprising a Universal programmer and a Potentiostat/Galvanostat, with recorder. The polymer coated end of the wire was then immersed into a 0.1M solution of lithium tetrafluoroborate in acetonitrile. A potential, varying from 0 to −3.0 volts vs. SCE was applied to the platinum wire. The output current was essentially nil until the potential reached about −1.5 volts. At that point the cathodic current increased rapidly and peaked at −2.0 volts. Upon reversal of the potential sweep, an anodic current was observed which peaked at −1.25 volts. When the initial −1.5 volt potential was applied, the polymer adhering to the wire turned from a pale yellow to a dark metallic color, which color disappeared upon raising the voltage to more than −1.5 volts.

This behavior indicates an initial resistance to passage of current followed by a rapid uptake of electrons resulting in a charged polymer containing lithium ions as the charge compensating dopant. In effect the polymer was made electroactive by the application by a potential of about −2 volts in the presence of an electrolyte capable of providing charge compensating ionic dopants.

Example 13a

Preparation of 4-Acetyl-2-(4$^1$-methoxy)benzoyl Aniline Monomer 38.2 g of NaOH was dissolved in methanol (200 ml) in a 1-liter 3-neck flask provided with a mechanical stirrer, reflux condenser, N$_2$ inlet and a heating mantle. 28.14 g (0.19 mol) of p-methoxyphenyl-acetonitrile was added followed by 40 g (0.191 moles) of p-nitro-acetophenone ethylene glycol ketal. The reaction was stirred mechanically under reflux for 22 hours.

The product was filtered off, washed with water and recrystallized from methanol.

The product had the formula:

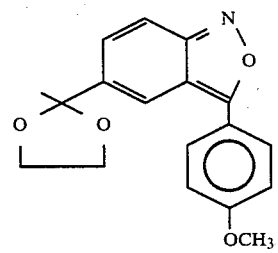

Analysis calculated for C$_{18}$H$_{17}$O$_4$N

|   | Calc. | Fnd. |
|---|-------|------|
| % C | 69.44 | 68.16% |
| H | 5.50 | 5.41 |
| N | 4.50 | 4.26 |

Example 13b

Hydrogenation of the Product of Example 13a 17.12 g (0.055 mol) of the product of Example 13a was dissolved in 150 ml of tetrahydrofuran and 4 ml of triethylamine in a 500 ml 3-neck flask provided with a gas inlet tube, reflux condenser, thermometer and a magnetic stirrer. 1.2 g of 5% Pd/carbon catalyst was added.

The flask was flushed with nitrogen and then connected to a slow stream of hydrogen.

The reaction was stirred magnetically at room temperature for 9 hours.

Thin layer chromatography indicated complete reaction.

The reaction was flushed with nitrogen, and the catalyst filtered off through celite.

The filtrate was evaporated to an oily residue, 19.3 g.

The product had the formula:

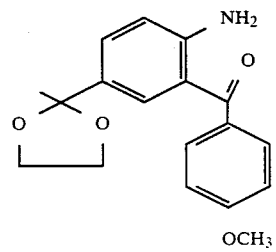

Example 13c

Hydrolysis of the Product of Example 13b 19.1 g of the product of Example 13b was dissolved in 60 ml of tetrahydrofuran and 30 ml of water in a 250 ml round bottom flask. The pH of the solution was adjusted to approximately 3 with conc. HCl and the reaction allowed to stand at room temperature for approximately 18 hours.

Thin layer chromatography showed complete hydrolysis.

The reaction mixture was poured into 300 ml of saturated $Na_2CO_3$ solution and extracted three times with an equal volume of methylene chloride.

The combined methylene chloride solution was washed with water, dried and evaporated to give 14.5 g of yellow residue.

The product was recrystallized from methylenechloride-hexane m.p. 119°–123° C.

The product had the formula:

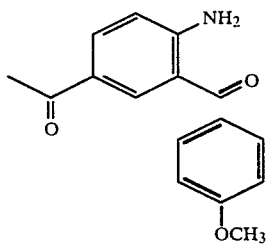

Analysis calculated for $C_{16}H_{15}O_3N$

|     | Calc. | Fnd.   |
| --- | ----- | ------ |
| % C | 71.36 | 71.33% |
| % H | 5.61  | 5.69   |
| % N | 5.20  | 5.78   |

Example 13d

Preparation of Poly[2,6-(4-p-methoxyphenyl)quinoline]

The catalyst solution was prepared by dissolving 9.44 g (66.5 mmoles) of $P_2O_5$ (weighed in a dry box) in 24 ml of m-cresol (Aldrich gold label) in a 50 ml 3-neck round bottom flask fitted with a mechanical stirrer, reflux condenser and an $N_2$ inlet.

The catalyst solution was mechanically stirred and heated in an oil bath at 105° C., under an $N_2$ blanket, until the solution became homogeneous (approximately 2½ hours). 3 g (11.16 mmoles) of the monomer of Example 13c was added followed by 10 ml of m-cresol. The temperature of the oil bath was increased to 120° and the polymerization reaction run of this temperature for 48 hours. The color of the solution changed from gold to deep red and the solution became more viscous.

The polymerization solution was poured slowly into 500 ml of a 10% solution of triethylamine in ethanol and stirred at room temperature overnight. On neutralization the polymer formed a spindle.

The polymer was collected by filtration, washed with ethanol and extracted with ethanol in a Soxhlet extractor overnight.

Following the extraction, it was filtered and dried in vacuo at 70° C. to give 2.3 g (88.5%) of dry polymer.

The polymer had the formula:

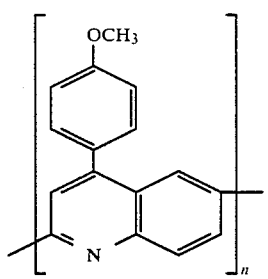

Analysis:

|     | Calc.* | Fnd.  |
| --- | ------ | ----- |
| % C | 82.38  | 78.52 |
| H   | 4.75   | 4.40  |
| N   | 6.01   | 5.52  |

*$C_{16}H_{11}NO$ $[\eta] = 0.83$ dl/g (measured in $H_2SO_4$).

Thereafter, the polymer was rendered conductive in accordance with the procedures for Example 3 using 0.5 molar solution of sodium anthracenide in THF instead of sodium naphthalide. The conductivity was measured in accordance with Example 4. The polymer had a conductivity of 2.5 $ohm^{-1} cm^{-1}$.

Example 14

Poly[2,6-(1-Methyl-4-phenyl)quinolinium] methosulfated

Poly2,6-(4-phenylquinoline) coated platinum wires were placed in a 50 ml round bottom flask and covered with 10 ml of Dimethyl sulfate (Aldrich). The flask was fitted with a reflux condenser and a drying tube inside a hood. The reaction was allowed to stand at room temperature overnight and then heated at reflux for 6 hours.

After cooling, dimethyl sulfate solution was decanted off and the wires quenched with approximately 30 ml of a 10% solution of triethylamine in ethanol. Following neutralization the wires were thoroughly washed with ethanol and dried in vacuo at 80° C.

The polymer had the formula:

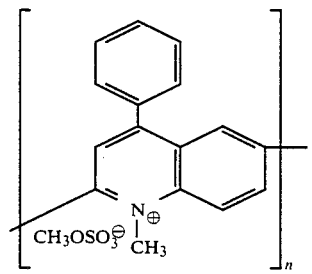

The polymer was rendered conductive in accordance with Example 3. However, the dopant was 0.5 molar sodium anthracenide in THF. The conductivity of the polymer was 0.75 $ohm^{-1} cm^{-1}$ as measured in accordance with Example 4.

Example 15

Electrochemical Doping of
Poly[2,6-(1-methyl-4-phenyl)quinolinium]

A 5-inch platinum wire was coated with a thin film of poly 2,6-(4-phenylquinoline) as in Example 10. The polymer was then quaternized as in Example 14.

The resulting polymer coated wire was connected to the apparatus described in Example 10 and immersed into a 0.1M solution of tetraethylammonium tetrafluoroborate in acetonitrile. A linear potential sweep varying from $-0.5$ to $-1.3$ volts vs. SCE was applied to the platinum wire. The output current was essentially nil until the potential reached about $-0.8$ volts, at which point the cathodic current increased rapidly, peaking at $-1.1$ volts. Upon reversal of the potential sweep, an anodic current was observed, peaking at $-0.8$ volts.

This behavior indicates an initial resistance to current flow followed by a rapid uptake of electrons to form a reduced polymer. In effect the polymer was made electroactive by the application of a potential of about $-1.1$ volts vs. SCE in the presence of an electrolyte solution.

Example 16

Electrochemical Doping of Copolymer From
4,4'-Diamino-3,3'-dibenzoyldiphenylether and
p-diacetylbenzene A 5-inch platinum wire was coated with a thin film of the polymer of Example 6d by dipping the wire into a 5% solution of the polymer in a m-cresol/$P_2O_5$ mixture. The film-coated wire was neutralized by dipping into a 10% triethylamine–90% ethanol solution and dried in a vacuum oven at 60° C.

The polymer coated wire was connected to the apparatus described in Example 10 and immersed into a 0.1M solution of tetraethylammonium tetrafluoroborate in acetonitrile. A linear potential sweep, varying from 0 to $-2.5$ volts vs. SCE was applied to the platinum wire. The output current was essentially nil until the potential reached about $-1.7$ volts. At that point the cathodic current increased rapidly to a maximum at $-2.2$ volts and exhibited a double wave with a peak separation of 200 mV. Upon reversal of the potential sweep an anodic current, also exhibiting a double wave, was observed at $-1.8$ volts. When the initial $-1.7$ volt potential was applied, the polymer adhering to the wire changed from a nearly colorless transparent appearance to a dark, metallic color. This color disappeared upon raising the voltage to greater than $-1.5$ volts.

This behavior indicates an initial resistance to current flow followed by a rapid uptake of electrons resulting in a charged polymer containing tetraethylammonium ion as the charge compensating ionic dopant. In effect the polymer was made electroactive by the application of a potential of about $-2.2$ volts vs. SCE in the presence of an electrolyte solution capable of providing charge compensating ionic dopants.

Example 17

Electrochemical Doping of Copolymer from
4,4'-Diamino-3,3'-dibenzoylbiphenyl and
4,4'-diacetylbiphenyl A 5-inch platinum wire was coated with a thin film of the polymer of Example 8d by dipping the wire into a 5% solution of the polymer in m-cresol/$P_2O_5$ mixture. The film-coated wire was neutralized by dipping into a 10% triethylamine-90% ethanol solution and dried in a vacuum oven at 60° C.

The polymer coated wire was connected to the apparatus described in Example 10 and immersed into a 0.1M solution of tetraethylammonium tetrafluoroborate in acetonitrile. A linear potential sweep, varying from 0 to $-2.5$ volts vs. SCE was applied to the platinum wire. The output current was essentially nil until the potential reached a value of $-1.7$ volts. At that point the cathodic current increased rapidly, peaking at $-2.0$ volts. Upon reversal of the potential sweep, an anodic current was observed, peaking at $-1.6$ volts. when the initial $-1.7$ volt potential was applied, the polymer adhering to the wire turned from pale yellow to a dark, metallic color. This color disappeared upon raising the voltage to greater than $-1.4$ volts.

This behavior indicates an initial resistance to current flow followed by a rapid uptake of electrons resulting in a charged polymer containing tetraethylammonium ion as the charge compensating ionic dopant. In effect the polymer was made electroactive by the application of a potential of about $-2.0$ volts vs. SCE in the presence of an electrolyte solution capable of providing charge compensating ionic dopants.

Example 18

Electrochemical Doping of Poly
2,6-(4-(4'-chlorophenyl)quinoline)

A 5-inch platinum wire was coated with a thin film of the polymer of Example 9 by dipping the wire into a 5% solution of the polymer in a m-cresol/$P_2O_5$ mixture. The film-coated wire was neutralized by dipping into a 10% triethylamine-90% ethanol solution and dried in a vacuum oven at 60° C.

The polymer-coated wire was connected to the apparatus described in Example 10 and immersed into a 0.1M solution of tetrabutylammonium bromide in acetonitrile. A linear potential sweep, varying from 0 to $-2.3$ volts vs. SCE was applied to the platinum wire. The output current was essentially nil until the potential reached about $-1.5$ volts. At that point the cathodic current increased rapidly, peaking at $-1.8$ volts. Upon reversal of the potential sweep an anodic current was observed, peaking at $-1.3$ volts. When the initial $-1.5$ volt potential was applied, the polymer adhering to the wire turned to a dark metallic color. This color disappeared upon raising the voltage to greater than $-1.2$ volts.

This behavior indicates an initial resistance to current flow followed by a rapid uptake of electrons resulting in a charged polymer containing tetraethylammonium ion as the charge compensating ionic dopant. In effect the polymer was made electroactive by the application of a potential of about $-1.8$ volts vs. SCE in the presence of an electrolyte solution capable of providing charge compensating ionic dopants.

Example 19

Electrochemical Doping of Poly
2,6-(4-(4'-methoxyphenyl)quinoline)

A 5-inch platinum wire was coated with a thin film of the polymer of Example 13d by dipping the wire into a 5% solution of the polymer in a m-cresol/$P_2O_5$ mixture. The film-coated wire was neutralized by dipping into a 10% triethylamine-90% ethanol solution and dried in a vacuum oven at 60° C.

The polymer-coated wire was connected to the apparatus described in Example 10 and immersed into a 0.1M solution of tetrabutylammonium bromide in acetonitrile. A linear potential sweep, varying from 0 to $-2.3$ volts vs. SCE was applied to the platinum wire. The output current was essentially nil until the potential reached about $-1.5$ volts. At that point the cathodic current increased rapidly, peaking at $-2.1$ volts. Upon reversal of the potential sweep an anodic current was observed, peaking at $-1.5$ volts. When the initial $-1.5$ volt potential was applied, the polymer adhering to the wire turned to a dark metallic color. This color disappeared upon raising the voltage to greater than $-1.3$ volts.

This behavior indicates an initial resistance to current flow followed by a rapid uptake of electrons resulting in a charged polymer containing tetraethylammonium ion as the charge compensating ionic dopant. In effect the polymer was made electroactive by the application of a potential of about $-2.1$ volts vs. SCE in the presence of an electrolyte solution capable of providing charge compensating ionic dopants.

Example 20

Doping and Conductivity Measurement of Poly 2,6-(4-phenylquinoline)

The polymer poly 2,6-(4-phenylquinoline) was doped and rendered electroactive in accordance with Examples 3 and 4. However, the conductivity modifier was 0.5 molar sodium anthracenide in THF. The conductivity of the electroactive polymer was 20 ohm$^{-1}$ cm$^{-1}$.

Example 21

Doping and Conductivity Measurement of Poly 2,6-(4-(4'-chlorophenyl)quinoline)

The polymer of Example 9 was doped and rendered electroactive and the conductivity thereof was determined in accordance with Examples 3 and 4. However, the conductivity modifier was 0.5 molar sodium anthracenide in THF. The conductivity of the electroactive polymer was 1.25 ohm$^{-1}$ cm$^{-1}$.

Example 22

Doping and Conductivity Measurement of Poly 2,6-(4-phenylquinoline)

The polymer poly 2,6-(4-phenylquinoline) was doped and rendered electroactive and the conductivity thereof was determined in accordance with Examples 3 and 4. However, the conductivity modifier was 0.1 molar sodium anthracenide in THF. The conductivity of the electroactive polymer was 15 ohm$^{-1}$ cm$^{-1}$.

Example 23

Doping and Conductivity Measurement of Poly 2,6-(4-phenylquinoline)

The polymer poly 2,6-(4-phenylquinoline) was doped and rendered electroactive and the conductivity thereof was determined in accordance with Examples 3 and 4. However, the conductivity modifier was 0.01 molar sodium anthracenide in THF. The conductivity of the electroactive polymer was 15 ohm$^{-1}$ cm$^{-1}$.

Example 24

Doping and Conductivity Measurement of Poly 2,6-(4-phenylquinoline)

The polymer poly 2,6-(4-phenylquinoline) was doped and rendered electroactive in accordance with Examples 3 and 4. However, the conductivity modifier was 0.005 molar sodium anthracenide in THF. The conductivity of the electroactive polymer was 2.75 ohm$^{-1}$ cm$^{-1}$.

Example 25

Chemical Doping of Poly 2,6-(4-phenylquinoline) Powder 0.52 gm of finely ground poly-(4-phenylquinoline) powder prepared by the method described in Example 1 was placed in a small wide-mouth jar. The polymer and jar were placed in a vacuum oven at 60° C. for 24 hours to dry. The jar containing the polymer was placed in an inert atmosphere dry box where it was allowed to equilibrate for 72 hours. Freshly distilled and degassed THF was introduced into the jar containing the polymer in order to preswell the polymeric granules. After a period of 20 minutes, the THF was filtered off and replaced with 6 ml of 0.09M solution of sodium anthracenide in THF. The polymer was allowed to contact the sodium anthracenide dopant solution for a period of 5 minutes at which time it was filtered off. Immediately upon contact with the doping solution, the polymer changed its color to a deep blue-black from its original yellow-orange. The doped polymer powder was thoroughly rinsed with large excess of fresh THF and allowed to dry.

Example 26

Dissolution of Chemically Doped Poly 2,6-(4-phenylquinoline)

Doped poly 2,6-(4-phenylquinoline) powder prepared by the method of Example 25 was dissolved in P$_2$O$_5$/m-cresol mixture described in Example 2. The dissolution of the doped polymer in the P$_2$O$_5$/m-cresol solvent was carried out in the inert atmosphere dry box. In the process of dissolving the blue-black color of the polymer slowly disappeared and the solution developed a deep red color. The vessel containing the partially dissolved polymer was removed from the dry box and immersed in an oil bath maintained at 100° C. until the dissolution process was complete.

Example 27

Casting of Free-Standing Films

Free-standing films of poly 2,6-(4-phenylquinoline) were cast from the solution described in Example 26, using the procedure described in Example 2.

Example 28

Chemical Doping of Free-Standing Films Prepared in Example 27

Free-standing films of poly 2,6-(4-phenylquinoline) prepared by the procedure of Example 27 were doped with 0.1M solution of sodium anthracenide in THF using the methods described in Example 20. The conductivity of the doped free-standing film was measured with a four-point probe as described in Example 4. A conductivity of 9.55 ohm$^{-1}$ cm$^{-1}$ measured.

Example 29

Casting of Free-Standing Films of Poly-Phenylquinoxaline

Poly-phenylquinoxaline dissolved in m-cresol was purchased from Scientific Polymer Products (6265 Dean Parkway, Ontario, N.Y. 14519. Catalog #330, Lot #01). Free-standing films were cast using the procedure described in Example 2, except that neutralization occurred either in methanol or water.

Example 30

Electrochemical Synthesis of Tetraethyl Ammonium Anthracenide Dopant

To 100 ml of 0.1M $Et_4N^+$ $BF_4^-$ in dry acetonitrite was added 0.0025 mole of anthracene. The solution/suspension was placed in a 200-ml beaker in the inert atmosphere dry box and fitted with a mechanical stirrer, Pt gauze working electrode, $Ag/AgNO_3$ reference electrode, and a Pt foil counter electrode (isolated by a porous Vycor tube). The working electrode was held at $-2.5$ V vs. $Ag/AgNO_3$ during 1 hour while the solution was stirred. The current passed ranged from 30–40 mA. The resulting dark blue solution was used immediately.

Example 31

Chemical Doping of Polyphenylquinoxaline Free-standing Films

Free-standing films as described in Example 29 were immersed in high purity grade acetonitrile for 24 hours in an inert atmosphere dry box. The soaked films were placed directly into an electrochemical cell which was producing the dopant solution described in Example 30. The films were allowed to contact the dopant for a period of 11 minutes. Upon contact with the dopant solution, the films changed their color from their original brown to a deep blue-black with metallic luster. The doped films were removed from the doping cell, washed with fresh acetonitrile and allowed to dry. The conductivity of the doped films was measured with a four-point probe using the procedures described in Example 4. A conductivity value of $3 \times 10^{-4}$ $ohm^{-1} cm^{-1}$ was measured.

Example 32

Preparation of 2-phenylquinoline

A 1-liter capacity flask equipped with $N_2$-bleeding tube, thermometer, paddle stirrer, and condenser was charged with 2-phenyl-4-quinolinecarboxylic acid, 227.7 g (0.90 mol), quinoline 200.0 g, and cupurons oxide 20.0 g (0.14 mol). The flask was heated with stirring to 200° C., and maintained at 200° C. for 1 hour. $CO_2$ started to evolve at about 120° C. The mixture was cooled to room temperature, and filtered by suction using filter aid and ether. Ether was evaporated from the filtrate in a vacuum evaporator, and the residue was subjected to fractional distillation under vacuum. A fraction was collected at 140° C./0.2 mmHg–155° C./0.5 mmHg which was 99+% pure 2-phenylquinoline by GC, NMR. M.p. 80°–84° C. The yield was 82.0 g (44%).

Example 33

Cyclic Voltametric Analysis of 2-phenylquinoline

A platinum disc working electrode, silver/silver nitrate reference electrode and platinum wire auxilliary electrode were immersed in an electrolyte solution of 0.1 molar lithium tetrafluoroborate in acetonitrile. Sufficient 2-phenylquinoline was added to achieve approximately $10^{-3}$ molar concentration. Upon sweeping the working electrode potential from 0 to $-2.7$ volts at a rate of 500 mV/sec, a reduction wave was observed at $-2.40$ V. On the reverse sweep, a re-oxidation wave appeared at $-2.32$ V, indicating that the 2-phenylquinoline undergoes a reversible reduction. Upon sweeping the working electrode potential to $+2.5$ V, a single oxidation wave was observed at $+1.7$ V. No reduction wave was present between $+2.5$ and 0 volts on the reverse sweep, indicating that this oxidation process is irreversible. Converting these potentials to values vs. the standard calomel electrode (SCE), yields a reversible reduction potential of $-2.02$ V vs. SCE.

The reduction potential of 2.02 V vs. SCE closely corresponds to the reduction potential of the polyquinoline of Example 10. These results suggest that 2 phenylquinoline can serve as a suitable monomeric repeat unit for polyquinoline.

Example 34

Preparation of 4-phenylquinoline

Example 34a

Preparation of 2-methyl-4-phenylquinoline

A solution of 29.55 g (0.15 mol) O-aminobenzophenone in 150 ml glacial acetic acid, 33 ml acetone, and 1.5 ml concentrated sulfuric acid was heated under reflux overnight. After cooling, the mixture was poured in 150 ml dilute ammonium hydroxide. The precipitated crude product was filtered off and recrystallized from ethanol to yield 28 g 2-methyl-4-phenylquinoline m.p. 100°–101° C. (lit 100°). For example, see the procedure of A. A. Fehnel, J. Org. Chem. 31, 2899 (1966), incorporated herein by reference.

Example 34b

Preparation of Phthalone of 2-methyl-4-phenylquinoline

A mixture of 10 grams 2-methyl-4-phenylquinoline, 10 grams phthalic anhydride and 2 grams zinc chloride was heated at 150°–160° C. during 8 hours. After first melting, the mixture soon solidified completely. After cooling, the solid mass was dissolved with gentle heating in 100 ml concentrated sulfuric acid. When solution was complete, the crude product was precipitated with 500 ml water and filtered. The yellow powder was digested in 600 ml 5% sodium bicarbonate to remove residual phthalic anhydride. After drying, 10.4 grams of the phthalone were obtained.

Example 34c

Preparation of 4-phenylquinoline-2-carboxylic Acid

Five grams of the phthalone from 34b was suspended in 50 ml water. A solution of 12.5 grams chromium trioxide in 250 ml 10% sulfuric acid was added slowly while keeping the mixture at 70°–80° C. The yellow powder gradually darkened to orange. When a sample was completely soluble in hot 5% sodium hydroxide, the mixture was cooled and the chromate salt of 4-phenylquinoline-2-carboxylic acid filtered off. The salt was dissolved in 500 ml hot 5% sodium hydroxide and the solution filtered. The sodium salt of the acid was precipitated with excess concentrated sodium hydroxide. The salt was redissolved in 100 ml hot waer and the free acid precipitated by careful addition of sulfuric acid. m.p. 170°–171° C. (lit 171° C.).

Example 34d

Preparation of 4-phenylquinoline

Two grams of the carboxylic acid of 34c were slowly heated in a 50 ml round bottom flask to 180°–190° C. Carbon dioxide was rapidly evolved for about 20 minutes. After cooling the solid was dissolved in 50 ml dilute sulfuric acid and the impurities removed by extracting with ether. Addition of ammonium hydroxide precipitated the free base as an oil which rapidly solidified. The solid was recrystallized from dilute ethanol. m.p. 60–62 (lit 61° C.).

For example, for the Examples 34b, c and d see W. Königs and J. U. Nef, *Chem. Ber,* 19, 2427 (1895), incorporated herein by reference.

Example 34e

Cyclic Voltametric Analysis of 4-phenylquinoline

The identical procedure of Example 33 was employed except that a sufficient concentration of 4-phenylquinoline was dissolved in acetonitrile to achieve an approximate concentration of $10^{-3}M$. The cyclic voltamogram showed that 4-phenylquinoline exhibits a reversible reduction at a potential of $-2.0$ V vs. SCE. These results suggest that 4-phenylquinoline can serve as a suitable monomeric repeat unit for poly-2,6-(4-phenylquinoline). Furthermore, these results predict that poly2,6-(4-phenylquinoline) will be an electroactive polymer exhibiting n-type conductivity and a redox potential of approximately $-2.0$ V vs. SCE.

What is claimed is:

1. A tractable electroactive polymer comprising:
a linear charged polymer backbone and a sufficient concentration of charge compensating ionic dopant(s) associated therewith, wherein said linear polymer backbone is capable of undergoing reversible oxidation or reversible reduction or both to form said linear charged polymer backbone, said linear polymer backbone comprises diradical repeat units selected from the group consisting of a heterocyclic ring system including at least one Group 5B or Group 6B atom, wherein none of the ring carbon atoms is saturated, a heterocyclic ring system including at least one Group 5B or Group 6B atom wherein none of the ring carbon atoms is saturated and a connecting unit, and mixtures thereof, wherein said diradical repeat unit contains no exocyclic double bonds and said diradical unit in the form of a monomeric repeat unit is capable of undergoing reversible oxidation or reversible reduction or both to form a stable ionic species, wherein said ionic species is a charged atomic or molecular species in the condensed phase which maintains said ionic species chemical integrity throughout the course of the chemical process of undergoing reversible oxidation or reversible reduction or both, and wherein said connecting unit is a conjugated system or atom or group of atoms which maintain $\pi$ orbital overlap with the heterocyclic ring system without adversely affecting the reversible oxidation or reversible reduction or both of said linear polymer backbone, said connecting unit is selected from the group consisting of:

$-\text{O}-$; $-\text{S}-$; $-\text{CH}=\text{CH}$; $-\text{C}\equiv\text{C}-$;

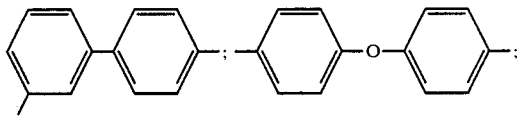

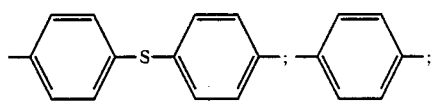

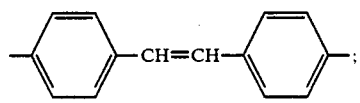

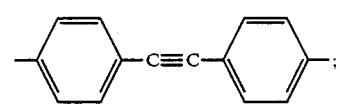

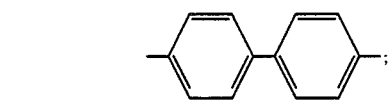

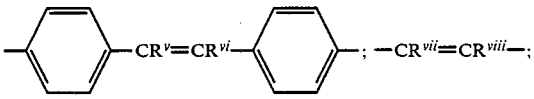; $-\text{CR}^{vii}=\text{CR}^{viii}-$;

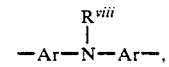

and atoms, groups of atoms and conjugated molecules which maintain $\pi$ orbital overlap with said heterocyclic ring system wherein $R^v$, $R^{vi}$ and $R^{vii}$ are H or methyl and mixtures thereof and $R^{viii}$ is lower alkyl $C_1$–$C_4$, or P-substituted phenyl, Ar is phenylene, or biphenylene, with the proviso that the heterocyclic ring system excludes fused 5,6-membered heterocyclic ring systems wherein two heteroatoms are in the 5-membered ring.

2. The electroactive polymer according to claim 1 wherein said Group 5B or 6B heteroatom is selected from the group consisting of N, P, As, O, S, Se, Te or mixtures thereof.

3. The electroactive polymer according to claim 2 wherein none of the heteroatoms occupy the ring fusion positions.

4. The electroactive polymer according to claim 3 wherein said heteroatom is selected from the group consisting of N, S, O, or mixtures thereof.

5. The electroactive polymer according to claim 4 wherein the heteroatoms are nitrogen and no more than two nitrogen atoms are bonded sequentially within the heterocyclic ring system.

6. The electroactive polymer according to claim 4 wherein the heteroatoms consisting of the group P, As, O, S, Se, Te do not occupy adjacent ring positions.

7. The electroactive polymer according to claim 3, 4, 5 or 6 wherein said linear charged polymer backbone is a polycation and said charge compensating ionic dopants are anions selected from the group consisting of $AsF_4^-$, $AsF_6^-$, $ClO_4^-$, $PF_6^-$, $Cl^-$, $F^-$, $Br^-$, $I^-$, $I_3^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, acetate, benoate, tosylate, or mixtures thereof.

8. The electroactive polymer according to claim 3, 4, 5 or 6 wherein the linear charged polymer backbone is a polyanion and the said charge compensating ionic dopants are cations selected from the group consisting of the alkali metal ions, alkali earth metal ions, Group III metal ions,

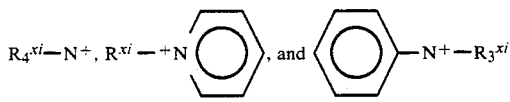

wherein $R^{xi}$ is a straight or branched chain alkyl of $C_1$-$C_6$ groups, or mixtures of said cations.

9. The electroactive polymer according to claim 4 wherein the charge compensating ionic dopant is a cation selected from the group consisting of the alkali metal ions, alkali earth metal ions, Group III metal ions,

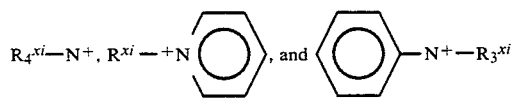

wherein $R^{xi}$ is a straight or branched chain alkyl of $C_1$-$C_6$ groups, or mixtures of said cations.

10. The electroactive polymer according to claim 9 wherein the recurring diradical units of the linear charged polymer backbone are diradicals of fused nitrogen-containing unsaturated heterocyclic ring system.

11. The electroactive polymer according to claim 10 wherein the diradicals are fused 6,6-membered heterocyclic ring system containing from one to six nitrogen atoms distributed within and among the fused six-member rings wherein no more than two nitrogens are bonded sequentially within said ring system and none of the nitrogens occupies the ring fusion position.

12. The electroactive polymer according to claim 10 wherein the diradicals have one nitrogen atom and second heteroatom selected from the group consisting of O, S, P, Se, Te and N-alkyl substituted N.

13. The electroactive polymer according to claim 1, 4, 11, or 12 wherein the diradical heterocyclic ring system is modified through the addition of substituent groups to a desired reversible oxidation potential or reduction potential or both without effecting the tractable nature of the polymer.

14. An electroactive polymer which comprises a linear charged polymer backbone and charge compensating ionic dopants associated therewith of the formula:

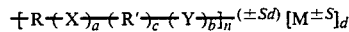

wherein a is 0 or 1; b is 0 or 1; c is 0 or 1; n is an integer from 2 to 2000; d is an integer from 1 to 4000; S is an integer 1, 2, or 3; R is a diradical of unsaturated heterocyclic ring system containing at least one Group 5B or 6B heteroatom, wherein none of the ring carbon atoms are saturated; R' is the same diradical as R or a different diradical unsaturated heterocyclic ring X is a diradical connecting unit; Y is the same diradical connecting unit as X or a different diradical connecting unit; and M is a charge compensating ionic dopant of opposite electrical charge to the charge of the polymer backbone wherein the polymer backbone is capable of undergoing reversible oxidation or reversible reduction or both to form said linear charged polymer backbone, said diradical or diradical-connecting unit in the form of a monomeric repeat unit is capable of undergoing reversible oxidation or reversible reduction or both to form a stable ionic species, wherein said ionic species is a charged atomic or molecular species in the condensed phase which maintains said ionic species chemical integrity throughout the course of the chemical process of undergoing reversible oxidation or reversible reduction or both, and wherein R and R', contain no exocyclic double bonds, and wherein said connecting unit is a conjugated system or atom or group of atoms which maintain $\pi$ orbital overlap with the heterocyclic ring system without adversely affecting the reversible oxidation or reversible reduction or both of said linear polymer backbone, said connecting unit is selected from the group consisting of:

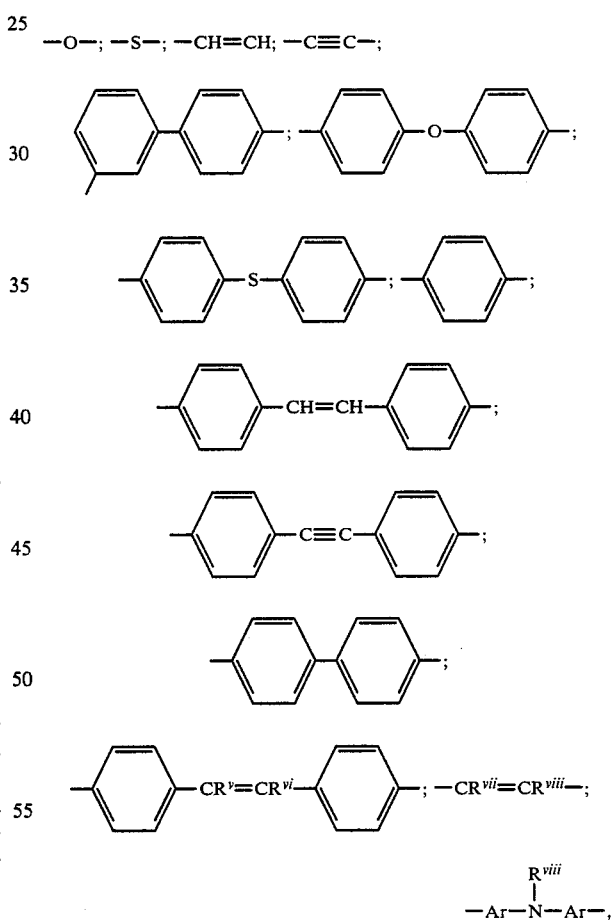

and atoms, groups of atoms and conjugated molecules which maintain $\pi$ orbital overlap with said heterocyclic ring system wherein $R^v$, $R^{vi}$ and $R^{vii}$ are H or methyl and mixtures thereof and $R^{viii}$ is lower alkyl $C_1$-$C_4$, or P-substituted phenyl, Ar is phenylene, or biphenylene, with the proviso that the heterocyclic ring system excludes fused 5,6-membered heterocyclic ring systems wherein two heteroatoms are in the 5-member ring.

15. The electroactive polymer according to claim 14 wherein said Group 5B or 6B heteroatom is selected from the group consisting of N, P, As, Sb, Bi, O, S, Se, Te or mixtures thereof.

16. The electroactive polymer according to claim 15 wherein said heteroatom is selected from the group consisting of N, S, O, or mixtures thereof.

17. The electroactive polymer according to claim 16 wherein said linear charged polymer backbone is a polycation and said charge compensating ionic dopants M are anions selected from the group consisting of $AsF_4^-$, $AsF_6^-$, $ClO_4^-$, $PF_6^-$, $SO_3CF_3^-$, $BF_4^-$, $NO_3^-$, $POF_4^-$, $CN^-$, $F^-$, $Cl^-$, $Bi^-$, $I^-$, $I_3^-$, $SiF_5^-$, $SbCl_6^-$, $SbF_6^-$, $HSO_4^-$, acetate, benzoate, tosylate, or mixtures thereof.

18. The electroactive polymer according to claim 16 wherein the linear charged polymer backbone is a polyanion and the said charge compensating ionic dopants M are cation is selected from the group consisting of alkali metal ions, alkali earth metal ions, Group III metal ions,

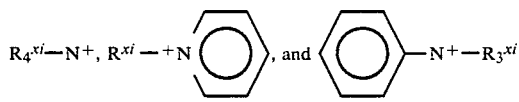

wherein $R^{xi}$ is a straight or branched chain alkyl of $C_1$-$C_6$ groups, or mixtures of said cations.

19. A process for fabricating a linear electroactive polymer of predetermined and preselected conductivity type, redox potential, work function, and geometric form comprising:

(a) synthesizing a polymer containing diradical repeat units whose monomeric repeat units are capable of undergoing a reversible oxidation and/or reduction process to form a stable ionic species, wherein said ionic species is a charged atomic or molecular species in the condensed phase which maintains said ionic species chemical integrity throughout the course of the chemical process of undergoing reversible oxidation or reversible reduction or both, said monomeric and corresponding diradical repeat units being selected from the group consisting of a heterocyclic ring system including at least one Group 5B or 6B atom, wherein none of the ring system carbon atoms is saturated, a heterocyclic ring system including at least one Group 5B or Group 6B atom wherein none of the ring system carbon atoms is saturated and a connecting unit, and mixtures thereof, said connecting unit is a conjugated system or an atom or a group of atoms which maintain π orbital overlap with the heterocyclic ring system without adversely affecting the reversible oxidation or reversible reduction or both of said linear polymer backbone, said connecting unit is selected from the group consisting of:

—O—; —S—; —CH=CH; —C≡C—;

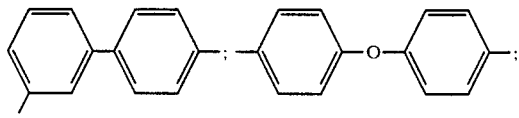

-continued

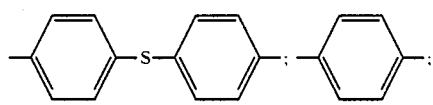

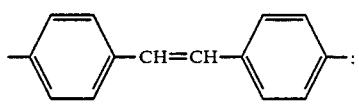

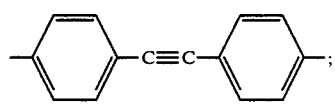

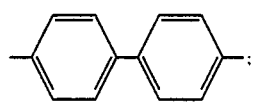

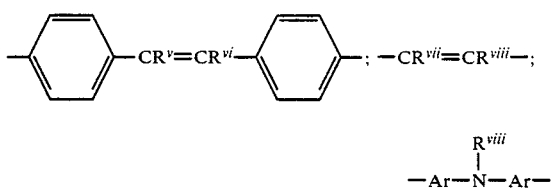

and atoms, groups of atoms and conjugated molecules which maintain π orbital overlap with said heterocyclic ring system wherein $R^v$, $R^{vi}$ and $R^{vii}$ are H or methyl and mixtures thereof and $R^{viii}$ is lower alkyl $C_1$-$C_4$, or P-substituted phenyl, Ar is phenylene, or biphenylene, wherein said diradical repeat unit is selected such that if a p-type polymeric electrical conductor is desired, the corresponding monomeric repeat unit exhibits a reversible oxidation process, wherein the desired electroactive polymer will exhibit a redox potential which is approximately equal to the redox potential of the monomeric repeat unit, said diradical repeat unit is selected such that if an n-type polymeric electrical conductor is desired, the corresponding monomeric repeat unit exhibits a reversible reduction process, wherein the desired electroactive polymer will exhibit a redox potential which is approximately equal to the redox potential of the monomeric repeat unit, said diradical repeat unit is selected such that if it is desired that the polymeric electrical conductor will exhibit both n- and p-type behavior, the corresponding monomeric repeat unit exhibits both reversible oxidation and reduction processes, wherein the desired electroactive polymer will exhibit redox potentials which are approximately equal to the redox potentials of the monomeric repeat unit;

(b) dissolving the polymer of step (a) in an appropriate solvent or otherwise causing said polymer to become fluids;

(c) processing the polymer of step (b) from the solution or fluid state into an object of desired shape, size, and geometry; and (d) subjecting the object of step (c) to oxidizing and/or reducing conditions as to cause said polymer to become charged incorporating therewith a sufficient concentration of charge compensating ionic dopants.

20. The process according to claim 19 wherein the heteroatoms are selected from the group consisting of N, P, As, O, S, Se, Te.

21. The process according to claim 20 wherein the heteroatoms are selected from N, O, S.

22. The process according to claim 21 wherein said reducing conditions comprise exposing said polymer to reducing agents selected from the group consisting of alkali naphthalenides, alkali anthracenides, tetraalkylammonium anthracenides and naphthalenides dissolved in a suitable solvent.

23. The process according to claim 21 wherein said reducing conditions comprise contacting said polymer with an inert electrode in the presence of an electrolyte solution containing charge compensating ionic dopants and electrochemically reducing said polymer and associating said polymer with said charge compensating cationic dopants selected from a group consisting of alkali metal ion, alkali earth metal ions, Group III metal ions,

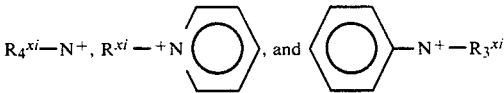

wherein $R^{xi}$ is a straight or branched chain alkyl of $C_1$–$C_6$ groups, or mixtures thereof.

24. The process according to claim 21 wherein said oxidizing conditions comprise exposing said polymer to oxidizing agents selected from the group consisting of $AsF_5$, $SbCl_5$, $SbF_5$, and halogen gases.

25. The process according to claim 21 wherein said oxidizing conditions comprise contacting said polymer with an inert electrode in the presence of an electrolyte solution containing charge compensating ionic dopants and electrochemically oxidizing said polymer and associating said polymer with said charge compensating anionic dopants selected from the group consisting of $AsF_4^-$, $AsF_6^-$, $ClO_4^-$, $PF_6^-$, $SO_3CF_3^-$, $BF_4^-$, $NO_3^-$, $POF_4^-$, $CN^-$, $F^-$, $Cl^-$, $Bi^-$, $I^-$, $I_3^-$, $SiF_5^-$, $SbCl_6^-$, $SbF_6^-$, $HSO_4^-$, acetate, benzoate, tosylate, or mixtures thereof.

* * * * *